(12) United States Patent
Lee et al.

(10) Patent No.: US 11,908,774 B2
(45) Date of Patent: Feb. 20, 2024

(54) SEMICONDUCTOR PACKAGE INCLUDING COMPOSITE MOLDING STRUCTURE

(71) Applicant: SAMSUNG ELECTRONICS CO., LTD., Suwon-si (KR)

(72) Inventors: Heeseok Lee, Suwon-si (KR); Yunhyeok Im, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 17/850,504

(22) Filed: Jun. 27, 2022

(65) Prior Publication Data

US 2022/0328381 A1 Oct. 13, 2022

Related U.S. Application Data

(63) Continuation of application No. 17/016,115, filed on Sep. 9, 2020, now Pat. No. 11,373,933.

(30) Foreign Application Priority Data

Feb. 27, 2020 (KR) .................... 10-2020-0024292

(51) Int. Cl.
*H01L 23/48* (2006.01)
*H01L 23/498* (2006.01)
(Continued)

(52) U.S. Cl.
CPC ........ *H01L 23/481* (2013.01); *H01L 23/3135* (2013.01); *H01L 23/498* (2013.01);
(Continued)

(58) Field of Classification Search
CPC ............. H01L 23/5384; H01L 23/5385; H01L 23/373; H01L 23/5389; H01L 23/3135;
(Continued)

(56) References Cited

U.S. PATENT DOCUMENTS 7,800,212 B2  9/2010  Yoon et al.
7,872,352 B2  1/2011  Inoue
(Continued)

FOREIGN PATENT DOCUMENTS

KR   100961311 B1   6/2010
KR   101550496 B1   9/2015

*Primary Examiner* — Laura M Menz
*Assistant Examiner* — Candice Chan
(74) *Attorney, Agent, or Firm* — Fish & Richardson P.C.

(57) ABSTRACT

A semiconductor package includes; a lower semiconductor chip mounted on a lower package substrate, an interposer on the lower package substrate and including an opening, connection terminals spaced apart from and at least partially surrounding the lower semiconductor chip and extending between the lower package substrate and the interposer, a first molding member including a first material and covering at least a portion of a top surface of the lower semiconductor chip and at least portions of edge surfaces of the lower semiconductor chip, wherein the first molding member includes a protrusion that extends upward from the opening to cover at least portions of a top surface of the interposer proximate to the opening, and a second molding member including a second material, at least partially surrounding the first molding member, and covering side surfaces of the first molding member and the connection terminals, wherein the first material has thermal conductivity greater than the second material.

10 Claims, 26 Drawing Sheets

(51) Int. Cl.
  *H01L 23/31*    (2006.01)
  *H01L 25/10*    (2006.01)
  *H01L 23/40*    (2006.01)

(52) U.S. Cl.
  CPC .... *H01L 25/105* (2013.01); *H01L 2023/4087* (2013.01); *H01L 2225/1011* (2013.01); *H01L 2225/1041* (2013.01)

(58) Field of Classification Search
  CPC ............ H01L 23/3185; H01L 23/3192; H01L 23/481; H01L 23/198; H01L 23/3128; H01L 23/49811; H01L 23/49827; H01L 25/10–13; H01L 2225/10–1094
  See application file for complete search history.

(56) References Cited

U.S. PATENT DOCUMENTS

| | | |
|---|---|---|
| 8,409,917 B2 | 4/2013 | Yoon et al. |
| 8,432,028 B2 | 4/2013 | Kim et al. |
| 8,941,225 B2 | 1/2015 | Choi et al. |
| 9,337,135 B2 | 5/2016 | Lii et al. |
| 9,620,484 B2 | 4/2017 | Kim |
| 9,633,937 B2 | 4/2017 | Fei et al. |
| 9,666,517 B2 | 5/2017 | Kim |
| 2014/0339708 A1 | 11/2014 | Jang et al. |
| 2016/0043047 A1 | 2/2016 | Shim et al. |
| 2018/0374833 A1 | 12/2018 | Wong et al. |
| 2019/0131241 A1 | 5/2019 | Jeng et al. |
| 2021/0183757 A1 | 6/2021 | Kim et al. |

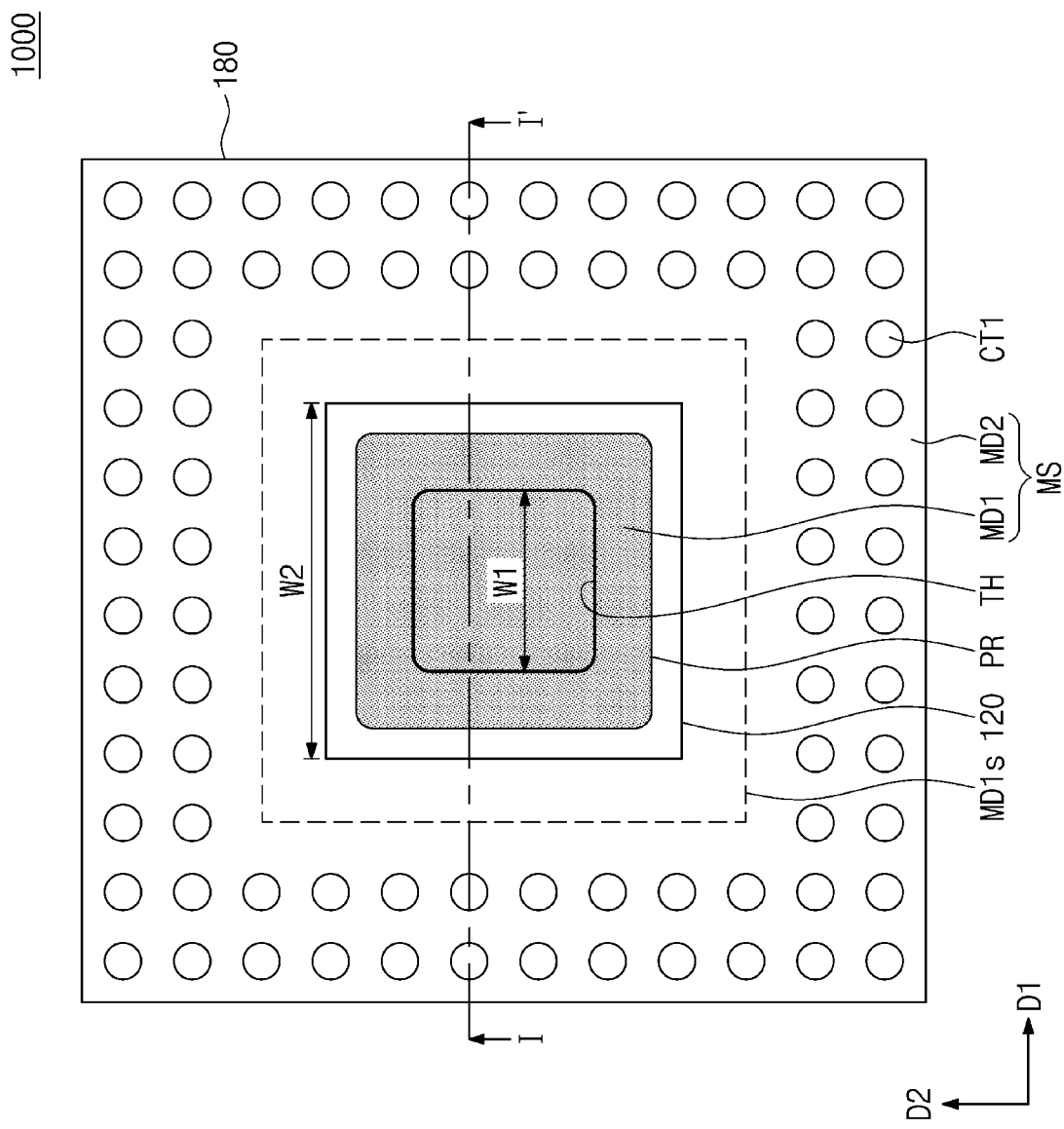

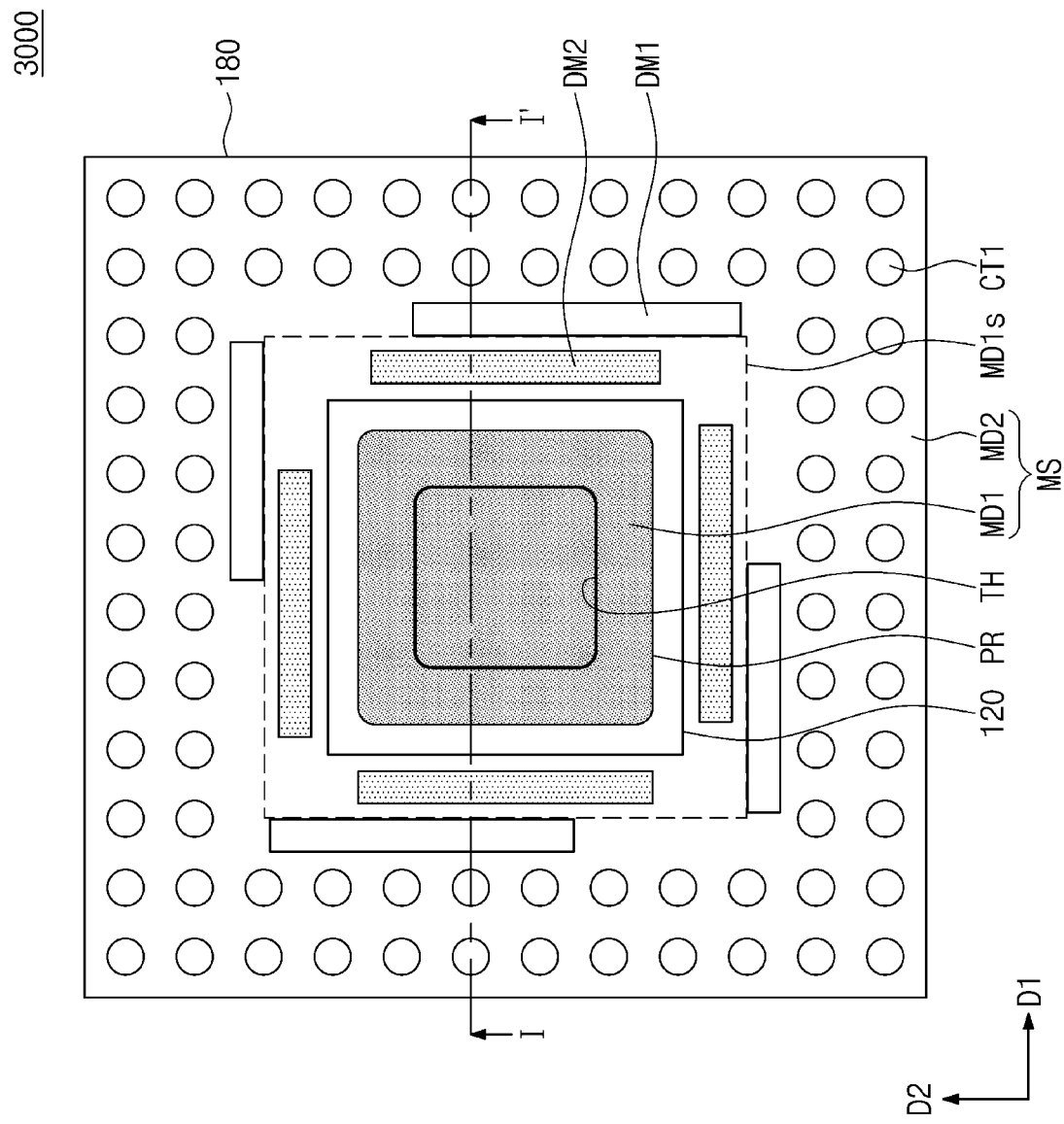

ND STRUCTURE

SEMICONDUCTOR PACKAGE INCLUDING COMPOSITE MOLDING STRUCTURE

CROSS-REFERENCE TO RELATED APPLICATION

This is a Continuation of U.S. application Ser. No. 17/016,115, filed Sep. 9, 2020, and a claim of priority under 35 U.S.C § 119 to Korean Patent Application No. 10-2020-0024292 filed on Feb. 27, 2020 in the Korean Intellectual Property Office, the disclosure of which is hereby incorporated by reference.

BACKGROUND

The inventive concept relates generally to semiconductor devices, and more particularly to semiconductor packages including a molding member.

In the semiconductor industry, semiconductor devices and their electronic products increasingly require high performance, rapid operating speeds, and compact sizes. In order to cope with this trend, there have been developed numerous stacking methods such as a plurality of semiconductor chips are stacked on a single substrate or a package is stacked on another package. A package-on-package (PoP) technique has been developed in which various semiconductor chips are vertically stacked to implement high-density chip stacking. The package-on-package technique may have an advantage capable of integrating semiconductor chips having various functions on a smaller area than a conventional package made of one semiconductor chip.

SUMMARY

Embodiments of the inventive concept provide a semiconductor package having improved reliability. Embodiments of the inventive concept also provide a method of fabricating semiconductor packages is capable of reducing the overall height of the semiconductor package.

According to embodiments of the inventive concept, a semiconductor package includes; a lower semiconductor chip mounted on a top surface of a lower package substrate, an interposer disposed above the lower package substrate and including an opening exposing at least a portion of the lower semiconductor chip, connection terminals spaced apart from and at least partially surrounding the lower semiconductor chip and extending between the lower package substrate and the interposer, a first molding member including a first material and covering at least a portion of a top surface of the lower semiconductor chip and at least portions of edge surfaces of the lower semiconductor chip, wherein the first molding member includes a protrusion that extends upward from the opening to cover at least portions of a top surface of the interposer proximate to the opening, and a second molding member including a second material, at least partially surrounding the first molding member, and covering side surfaces of the first molding member and the connection terminals, wherein the first material has thermal conductivity greater than thermal conductivity of the second material.

According to embodiments of the inventive concept, a semiconductor package includes; a lower semiconductor chip mounted on a top surface of a lower package substrate, an interposer disposed above the lower package substrate and including an opening, connection terminals spaced apart from and at least partially surrounding the lower semiconductor chip and extending between the lower package substrate and the interposer, a first molding member including a first material, filling the opening and covering at least portions of a top surface of the interposer proximate to the opening, and a second molding member including a second material different from the first material, covering the connection terminals, covering edge surfaces of the lower semiconductor chip, and covering a top surface of the lower semiconductor chip, such that the second molding member contacts a bottom surface of the interposer, and extends laterally across the entire top surface of the lower semiconductor chip between the lower semiconductor chip and the first molding member, wherein the first material has thermal conductivity greater than thermal conductivity of the second material.

According to embodiments of the inventive concept, a method of fabricating a semiconductor package includes; mounting a lower semiconductor chip on a top surface of a lower package substrate using an under-fill layer between the lower package substrate and the lower semiconductor chip, forming first bumps on the top surface of the lower package substrate to at least partially surround the lower semiconductor chip, forming second bumps on a bottom surface of an interposer opposing the top surface of the lower package substrate, wherein the second bumps are aligned with the first bumps, reflowing at least one of the first bumps and the second bumps to form connection terminals spaced apart from and at least partially surrounding the lower semiconductor chip, forming an opening in a central portion of the interposer to at least partially expose a top surface of the lower semiconductor chip, using a molding injector including an injection part to introduce a first melted material through the opening to form a first molding member including a protrusion shaped by the injection part, wherein the first molding member covers a top surface of the lower semiconductor chip and edge surfaces of the lower semiconductor chip exposed from the under-fill layer, and laterally introducing a second melted material between the interposer and the lower package substrate to form a second molding member covering the connection terminals and side surfaces of the first molding member, wherein the first material has thermal conductivity greater than thermal conductivity of the second material.

BRIEF DESCRIPTION OF THE DRAWINGS

FIG. 1A is a plan view illustrating a semiconductor package according to embodiments of the inventive concept.

FIG. 3A is a plan view illustrating a semiconductor package according to embodiments of the inventive concept.

DETAILED DESCRIPTION

Embodiments of the inventive concept will now be described with reference to the accompanying drawings.

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1B:
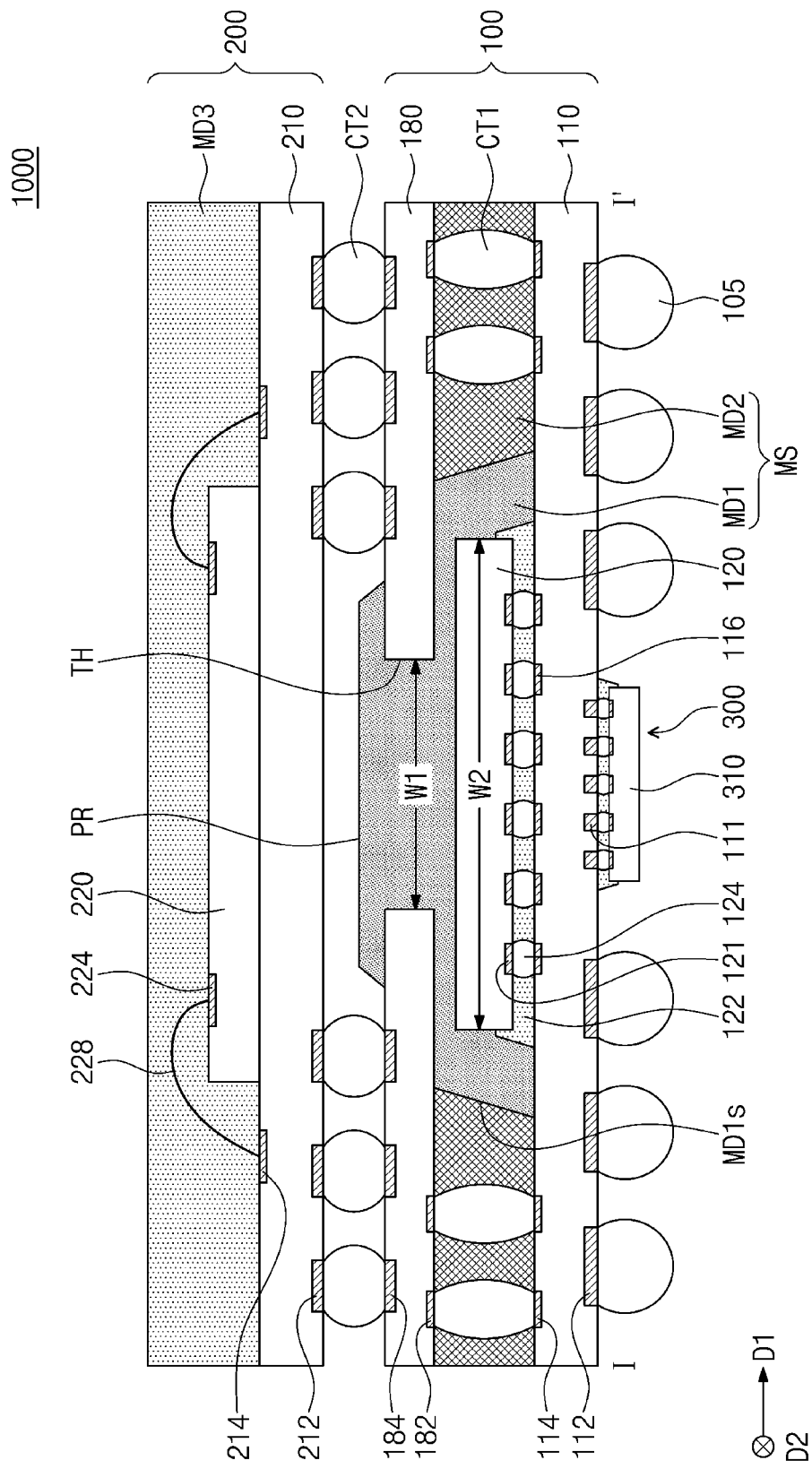
FIGS. 1B and 1C are respective cross-sectional views taken along line I-I' of FIG. 1A.
Figure 1C:
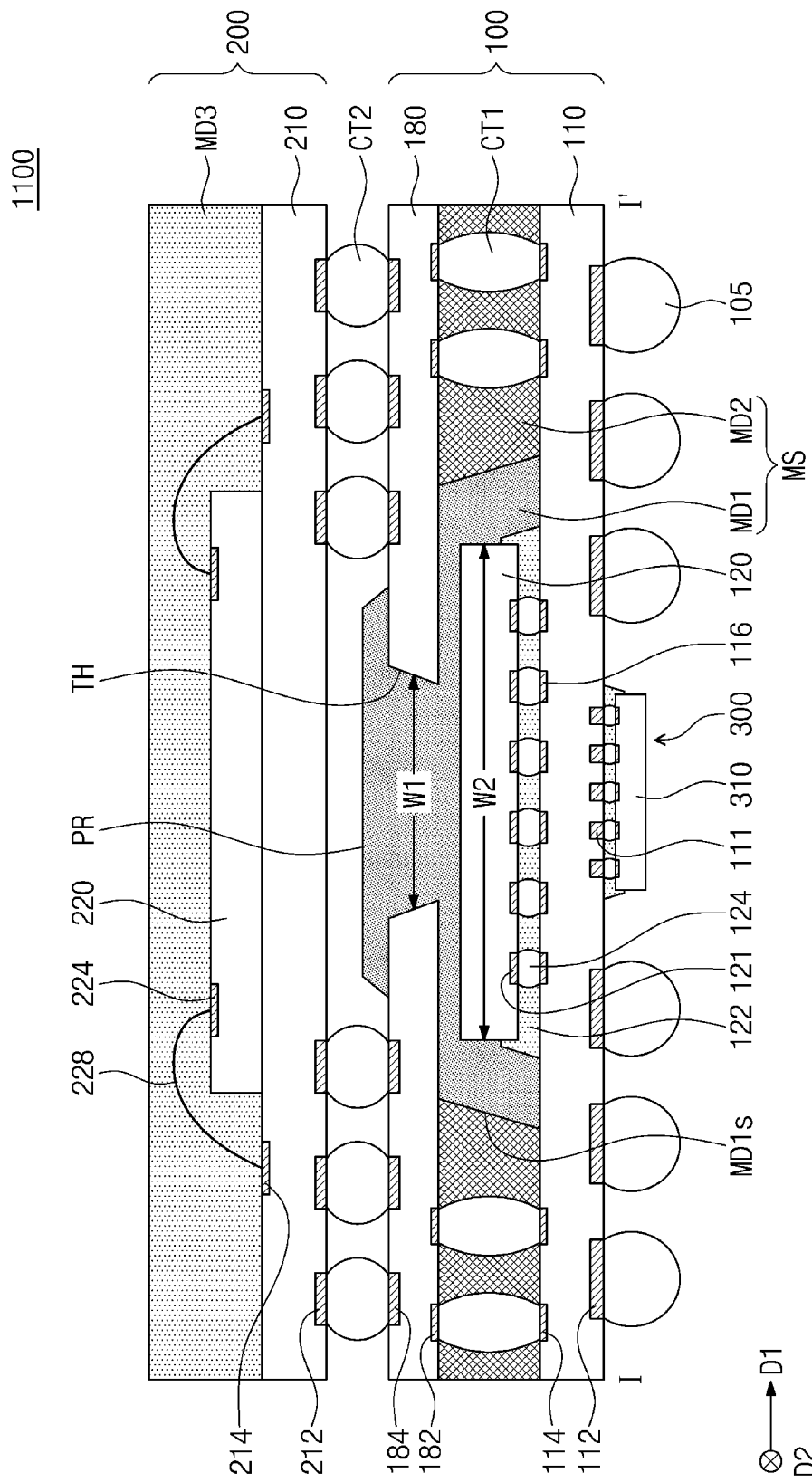

FIG. 1A is a plan (or top-down) view illustrating a semiconductor package 1000 according embodiments of the inventive concept. FIGS. 1B and 1C are respective cross-sectional views taken along line I-I' of FIG. 1A respectively illustrating the semiconductor package 1000 as well as an alternate semiconductor package 1100.

Referring to FIGS. 1A and 1B, the semiconductor package 1000 may include a lower package 100 and an upper package 200 disposed on (or over) the lower package 100.

The lower package 100 may include a lower package substrate 110, a lower semiconductor chip 120, a molding structure MS, an interposer 180, and a first connection terminal CT1.

The lower package substrate 110 may be a single-layered printed circuit board (PCB) including signal pattern(s) on top and/or bottom surfaces of the PCB. Alternatively, the lower package substrate 110 may be a multi-layered PCB including an alternately stacked arrangement of at least one dielectric layer and at least one wiring layer. The lower package substrate 110 may include first lower substrate pads 114 and second lower substrate pads 116 on a top surface, as well as external terminal pads 112 on a bottom surface.

External terminals 105 and third lower substrate pads 111 may be disposed below the lower package substrate 110, such that the external terminals 105 may be bonded to the external terminal pads 112. The external terminals 105 may include conductive bumps or solder balls and—based on the type of the external terminals 105—the lower package 100 may include a ball grid array (BGA), a fine ball-grid array (FBGA) or a land grid array (LGA).

The lower semiconductor chip 120 may be disposed (e.g., mounted) on the lower package substrate 110. The lower semiconductor chip 120 may be placed (or located) at a central portion of the lower package substrate 110. In some embodiments, the lower semiconductor chip 120 may be flip-chip mounted on the lower package substrate 110. For example, the lower semiconductor chip 120 may be electrically connected to the lower package substrate 110 using chip terminals 124 (e.g., solder balls or solder bumps). The chip terminals 124 may be provided between lower chip pads 121 on a bottom surface of the lower semiconductor chip 120 and the second lower substrate pads 116 of the lower package substrate 110.

The lower semiconductor chip 120 may be (e.g.,) a system on chip (SoC). The lower semiconductor chip 120 may include circuitry enabling various functions. For example, the lower semiconductor chip 120 may include a logic circuit and a memory circuit. The lower semiconductor chip 120 may further include (e.g.,) a digital integrated circuit (IC), a wireless radio frequency integrated circuit (RFIC), and/or an input/output (I/O) circuit.

An under-fill layer 122 may be disposed between the lower semiconductor chip 120 and the lower package substrate 110 to cover the top surface of the lower package substrate 110 and lateral surfaces of the chip terminals 124. The under-fill layer 122 may extend laterally beyond the length of the lower semiconductor chip 120 to cover at least part of end portions of the lower semiconductor chip 120.

A passive device package 300 may be disposed on the bottom surface of the lower package substrate 110. For example, the passive device package 300 may include a passive device 310 flip-chip mounted on the bottom surface of the lower package substrate 110. The passive device 310 may include (e.g.,) a land-side capacitor, and may be used to provide power to the lower semiconductor chip 120. The passive device 310 may be bonded to the third lower substrate pads 111.

The interposer 180 may be disposed over (i.e., above) the lower semiconductor chip 120. In certain embodiments of the inventive concept, the interposer may have a ring shape including an annular portion at least partially surrounding an opening. The interposer 180 may be vertically spaced above both the lower package substrate 110 and the lower semiconductor chip 120. The interposer 180 may include a dielectric substrate or a silicon substrate. First pads 182 may be disposed on a bottom surface of the interposer 180, and second pads 184 may be disposed on a top surface of the interposer 180.

As illustrated in FIG. 1A, an opening (e.g., a through hole TH) provided in the interposer 180 may at least partially expose the lower semiconductor chip 120. The through hole TH may be used to introduce one or more molding material(s), as will be described hereafter. The through hole TH may have vertical sidewalls separated by a substantially constant first width W1 in a first direction D1 parallel to the top surface of the lower package substrate 110. The lower semiconductor chip 120 may have a second width W2 in the first direction D1, where the first width W1 is less than the second width W2.

In the illustrated example of FIG. 1B, the sidewalls of the through hole TH, extending from the top surface to the bottom surface of the interposer 180, are substantially vertical providing a constant first width W1. However, in the illustrated example of FIG. 1C, the sidewalls of the through hole TH are angular (or inclined) providing a first width W1 that varies (e.g., decreases) as the sidewalls extend from the top surface to the bottom surface of the interposer 180. The through hole TH may be positioned or located in a central portion of the interposer 180, and when viewed in plan, the through hole TH may overlap at least some portion of the lower semiconductor chip 120.

The illustrated examples of FIGS. 1B and 1C assume the use of a through hole having a substantially rectangular shape. However, this need not always be the case. For example, the through hole TH may have a tetragonal shape including rounded (or sharp) corners, a circular shape, a triangular shape, etc.

First connection terminals CT1 may be disposed between the lower package substrate 110 and the interposer 180, and may selectively be used to connect the first pads 182 and the first lower substrate pads 114.

When viewed in plan, the first connection terminals CT1 may be laterally disposed at least partially around (or outside of) the lower semiconductor chip 120. In certain embodiments of the inventive concept, the first connection terminals CT1 may completely surround the through hole TH (and the lower semiconductor chip 120) and be laterally spaced apart around the through hole TH (and the lower semiconductor chip 120).

The molding structure MS may be provided between the lower package substrate 110 and the interposer 180. In certain embodiments of the inventive concept, the molding structure MS may be a composite molding structure include a first molding member MD1 and a second molding member MD2.

The first molding member MD1 may be introduced to cover at least a portion of the top surface of the lower semiconductor chip 120 and at least exposed portions of the edge surfaces of the lower semiconductor chip 120. The first molding member MD1 may substantially fill the through hole TH, and include a protrusion PR that extends upward from the through hole TH to cover (or overlap) portions of the top surface of the interposer 180 proximate to the through hole TH. The first molding member MD1 may include lateral portion(s) extending laterally to cover the top surface of the semiconductor chip 120 and descending portion(s) that extends downward to cover at least portions of the edge surfaces of the lower semiconductor chip 120 not covered by the under-fill layer 122. The first molding member MD1 may be surrounded by and spaced apart from the first connection terminals CT1.

The second molding member MD2 may extend laterally from the first molding member MD1 in an area between the interposer 180 and the lower package substrate 110 to cover the first connection terminals CT1. The second molding member MD2 may contact the first molding member MD1. Here, a boundary MD1s between the first molding member MD1 and the second molding member MD2 may be located between the first connection terminals CT1 and the lower semiconductor chip 120. In this manner, the second molding member MD2 may at least partially surround (in the first lateral direction D1 and the second lateral direction D2) the lower semiconductor chip 120.

In certain embodiments of the inventive concept, the first molding member MD1 may include a first material, and the second molding member MD2 may include a second material, where a thermal conductivity of the first material is greater than that of the second material. Additionally or alternately, the first material may have an electrical conductivity greater than that of the second material (e.g., the second material may be a non-conductive material). Additionally or alternately, the second material may have an elastic modulus greater than that of the first material. For example, the second material may have a polymer density greater than that of the first material.

With the foregoing in mind, the first material may include a molding material, such as an epoxy molding compound (EMC), a silver paste, and/or a copper paste having a first thermal conductivity equal to or greater than about 10 W/mK. In some embodiments, the first thermal conductivity may be equal to or less than about 100 W/mK. In contrast, the second material may include an epoxy molding compound (EMC) having a second thermal conductivity of greater than 0 W/mK and equal to or less than about 1 W/mK.

The molding structure MS may have a total volume in which the first molding member MD1 has a volume less than that of the second molding member MD2. For example, a volumetric ratio between the first molding member MD1 and the molding structure MS may be about ⅓, and a volumetric ratio between the second molding member MD2 and the molding structure MS may be about ⅔.

According to certain embodiments of the inventive concept, as the lower package 100 is at least partially surrounded by the first molding member MD1 and the second molding member MD2 which include different materials, the lower package 100 may exhibit reduced thermal resistance while maintaining relatively high mechanical rigidity. Here, the term "thermal resistance" may be understood (e.g.,) as a temperature difference (° C./W) when a power of 1 W is transferred from a heat source to a target object. Hence, a decrease of the thermal resistance may increase heat transfer from the heat source to the target object and may reduce a temperature difference between the heat source and the target object. Thus, the heat generated by the lower semiconductor chip 120 may be readily transferred to the first molding member MD1 that at least partially surrounds and covers the lower semiconductor chip 120. Further, since the first molding member MD1 completely fills and protrudes upward from the through hole TH of the interposer 180, heat generated by the lower semiconductor chip 120 may be readily exhausted away from lower package 100.

However, the second molding member MD2 may prevent the first molding member MD1 from contacting the first connection terminal CT1 and thereby causing electrical shorts. Further, since the second molding member MD2 has an elastic modulus greater than that of the first molding member MD1, it may reinforce the mechanical rigidity of the semiconductor package 1000. Taken together one or more of these features improves the reliability of the semiconductor package 1000.

Returning to FIGS. 1A, 1 and 1C, the upper package 200 may include an upper package substrate 210, an upper semiconductor chip 220, and a third molding member MD3.

The upper package substrate 210 may be disposed on the interposer 180. The upper package substrate 210 may be vertically spaced apart from the interposer 180. The protrusion PR of the first molding member MD1 may be spaced apart from a bottom surface of the upper package substrate 210. For example, the protrusion PR of the first molding member MD1 may have an uppermost surface that is lower level than the bottom surface of the upper package substrate 210.

The upper package substrate 210 may be a single-layered PCB including signal patterns on top and bottom surfaces. Alternatively, the upper package substrate 210 may be a multi-layered PCB.

Second external terminals CT2 may be disposed below the upper package substrate 210. The second connection terminals CT2 may be connected to first upper substrate pads 212 on a lower portion of the upper package substrate 210 and to the second pads 184 on an upper portion of the interposer 180. The second connection terminals CT2 may include solder balls or conductive bumps.

When viewed in plan, the second connection terminals CT2 may at least partially surround the through hole TH and be spaced apart from (i.e., not contacting) the first molding member MD1.

At least one upper semiconductor chip 220 may be disposed on the upper package substrate 210. The upper semiconductor chip 220 may be electrically wire-bonded to the upper package substrate 210. A bonding wire 228 may connect a second upper substrate pad 210 on a top surface of the upper package substrate 210 to an upper chip pad 224 on a top surface of the upper semiconductor chip 220. The upper semiconductor chip 220 may be electrically connected through the bonding wire 228 to the upper package substrate 210. Here, the upper semiconductor chip 220 may be attached through an adhesive layer to the top surface of the upper package substrate 210. In some example embodiments, the upper semiconductor chip 220 may be flip-chip mounted on the upper package substrate 210. The upper semiconductor chip 220 may be, for example, a memory chip. For example, the memory chip may be one of dynamic random access memory (DRAM), NAND Flash, NOR Flash, phase-change RAM (PRAM), resistive RAM (Re-RAM), and/or magneto-resistive RAM (MRAM).

The third molding member MD3 may be provided on the upper package substrate 210 to at least partially surround the upper semiconductor chip 220. That is, the third molding member MD3 may cover top and edge surfaces of the upper semiconductor chip 220. The third molding member MD3 may include a third material different from the first material of the first molding member MD1. For example, the third molding member MD3 may have a third thermal conductivity less than the first thermal conductivity of the first molding member MD1 and/or a third electrical conductivity that is less than the first electrical conductivity of the first molding member MD1. The third molding member MD3 may include a non-conductive material (e.g., an epoxy molding compound). In some embodiments, the third material may be the same as the second material of the second molding member MD2.

Figure 2A:
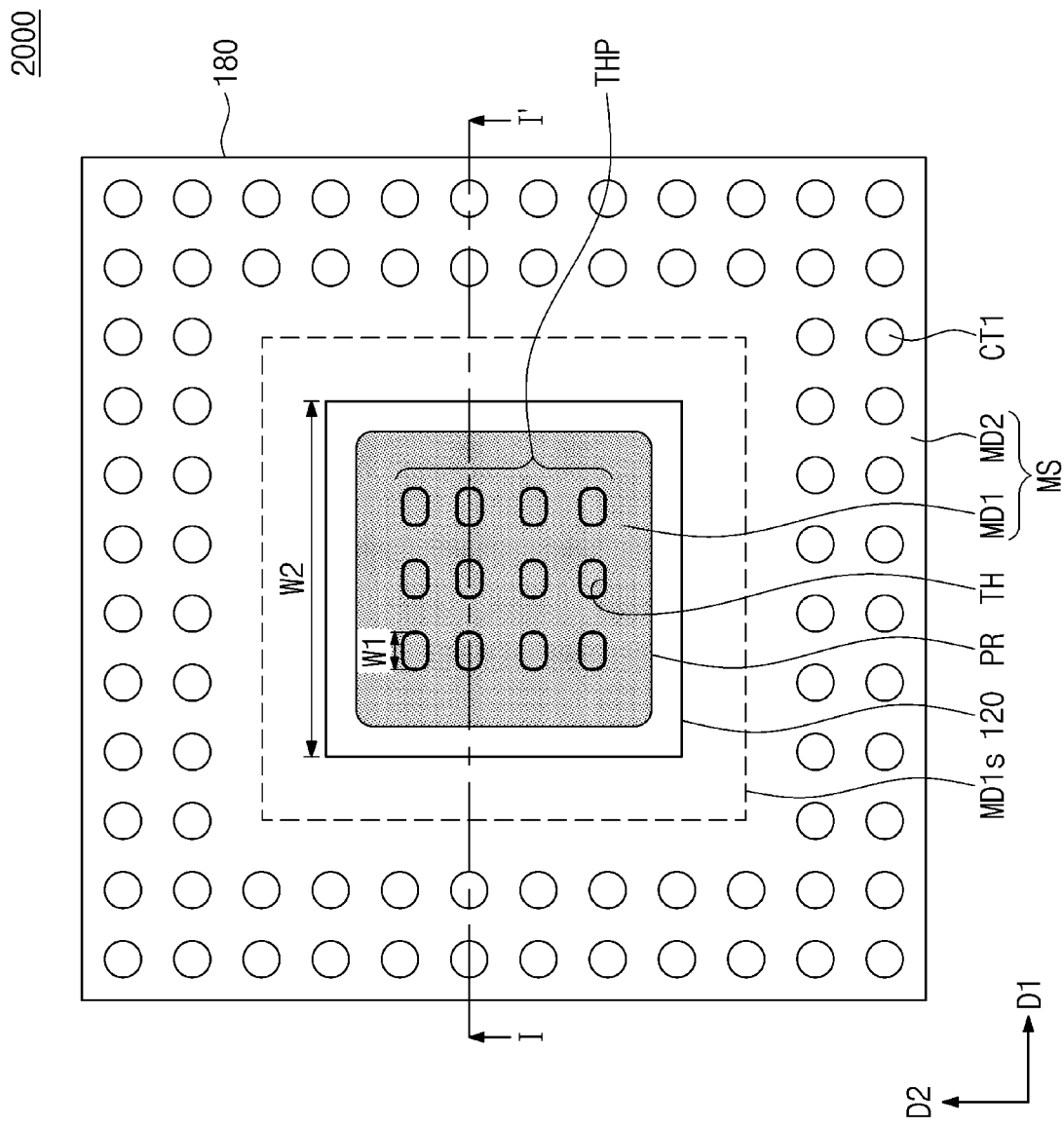
FIG. 2A is a plan view illustrating a semiconductor package according to embodiments of the inventive concept.
Figure 2B:
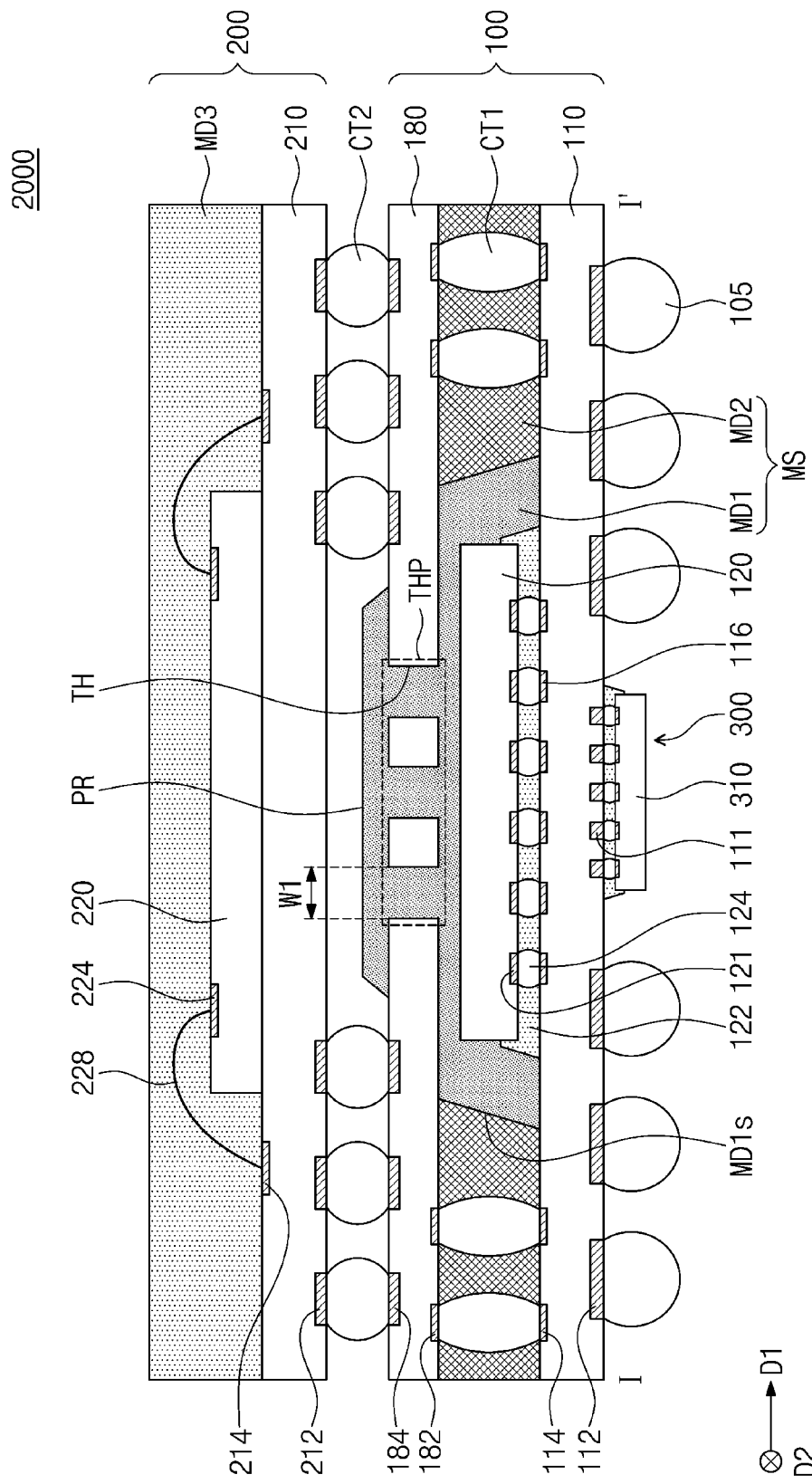
FIG. 2B is a cross-sectional view taken along line I-I' of FIG. 2A.

FIG. 2A is a plan view illustrating a semiconductor package 2000 according to embodiments of the inventive concept, and FIG. 2B is a cross-sectional view taken along line I-I' of FIG. 2A.

Referring to FIGS. 2A and 2B, the semiconductor package 2000 may include an interposer 180 including an opening formed by a plurality of through holes (or a through hole group THP).

The constellation of through holes TH forming the through hole group THP may be variously arranged in the first direction D1 and/or the second direction D2. Each through hole TH may have a first width W1 less than about half of a second width W2 in the first direction D1 of the lower semiconductor chip 120.

When viewed in plan, the through hole group THP may overlap, at least in part, the lower semiconductor chip 120. Each of the through holes TH in the through hole group THP may have a tetragonal shape with rounded or sharp corners, a circular shape, a triangular shape, etc.

Here, because the respective through holes TH of the through hole group THP have a relatively lesser, lateral width than, for example, the through hole TH of FIGS. 1A, 1B and 1C, the interposer 180 may exhibit increased, relative mechanical rigidity. Yet, the overall size of each respective through holes TH, as well as the opening area collectively provided by the through hole group THP, allow the introduction of at least one molding material.

Figure 3B:
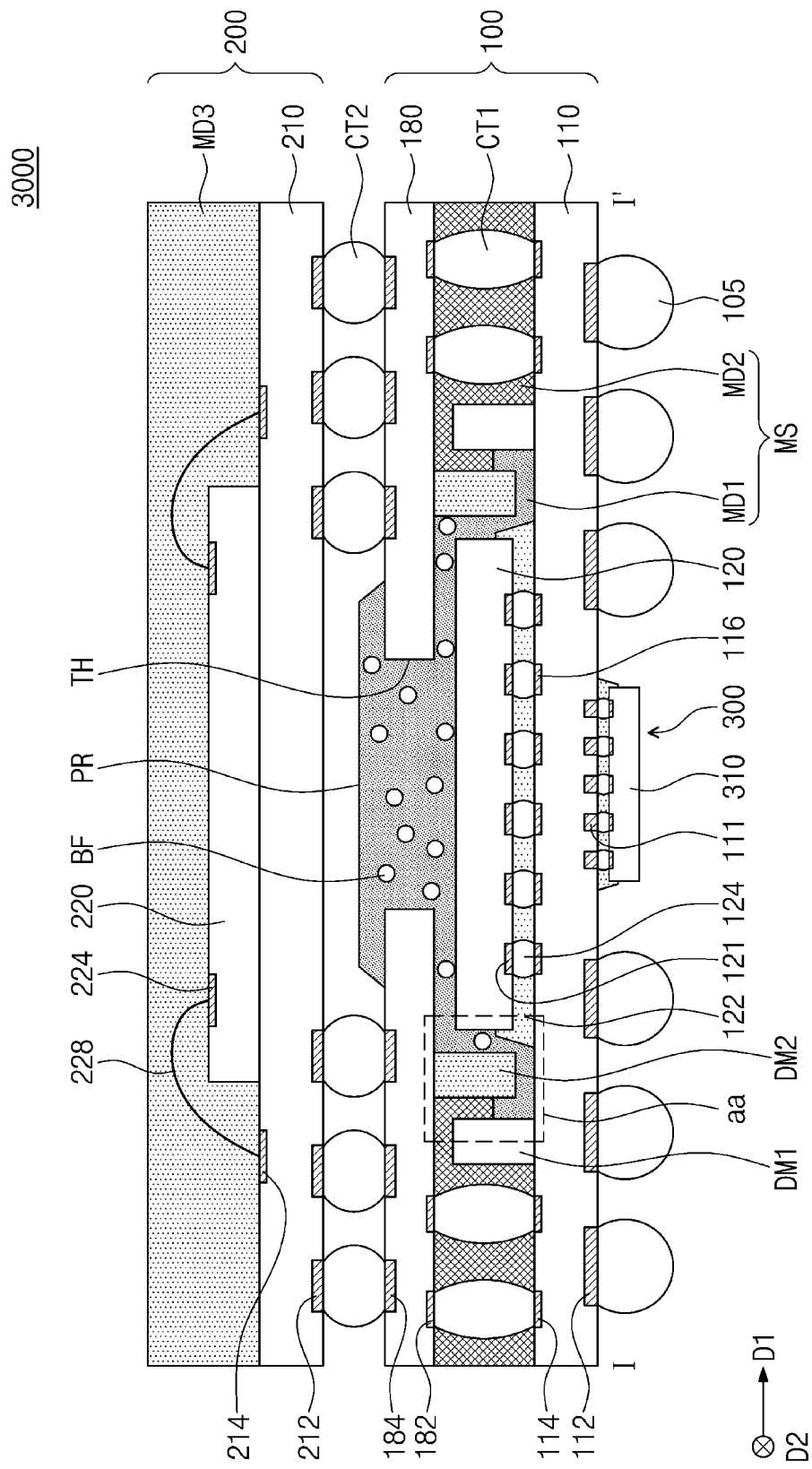
FIG. 3B is a cross-sectional views taken along line I-I' of FIG. 3A.
Figure 3C:
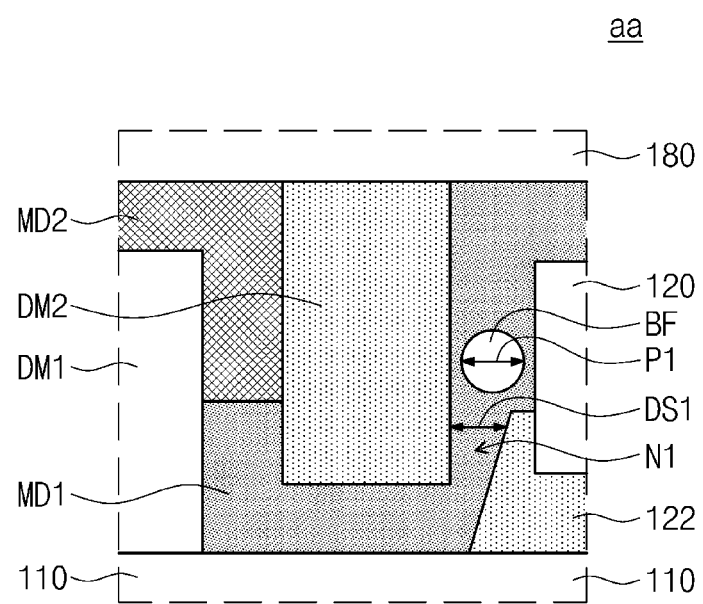
FIG. 3C is an enlarged view of section aa shown in FIG. 3B.

FIG. 3A is a plan view illustrating a semiconductor package 3000 according to embodiments of the inventive concept, FIG. 3B is a cross-sectional view taken along line I-I' of FIG. 3A, and FIG. 3C is an enlarged view of section 'aa' shown in FIG. 3B.

Referring to FIGS. 3A and 3B, one or more first barrier(s) DM1 may be provided on a top surface of the lower package substrate 110, and one or more second barrier(s) DM2 may be provided on a bottom surface of the interposer 180, wherein the top surface of the lower package substrate 110 vertically opposes the bottom surface of the interposer 180 in the arrangement of components in the semiconductor package 3000.

Here, the first barrier(s) DM1 may be first dam structure(s) and the second barrier(s) DM2 may be second dam structure(s). Accordingly, the first dam structures DM1, respectively mounted on the top surface of the lower package substrate 110, may be vertically spaced apart from the interposer 180, and the second dam structures DM2, respectively mounted on the bottom surface of the interposer 180, may be vertically spaced apart from the interposer 180. As may be seen in FIG. 3A, an arranged combination of the first dam structure(s) DM1 and the second dam structure(s) DM2 may at least partially surround the lower semiconductor chip 120. Further, each first dam structure DM1 may be spaced apart from the lower semiconductor chip 120 by a second dam structure DM2. The first dam structure DM1 and/or the second dam structure DM2 may include (e.g.) a solder resist, and neither the first dam structure DM1 nor the second dam structure DM2 may be electrically connected to the lower package substrate 110 or the interposer 180.

Referring to FIG. 3C, the first molding member MD1 may include a filler (or particle) BF having a diameter P1. The filler BF may have a spherical shape, but the shape of the filler BF is not limited thereto. The filler BF may include at least one conductive metallic material such as silver or copper.

The filler BF may be introduced into a space N1 between the first dam structure DM1 and the under-fill layer 122. In some embodiments, the diameter P1 of the filler BF may be greater than a width DS1 of the space N1 between the first dam structure DM1 and the under-fill layer 122.

According to certain embodiments of the inventive concept, when the first molding member MD1 is introduced through the through hole TH into a gap between the interposer 180 and the lower package substrate 110, the provision of the first dam structure DM1 and/or the second dam structure DM2 may prevent the first molding member MD1 from contacting the first connection terminal CT1. Moreover, the provision of the filler BF may interrupt the flow of the first molding member MD1 in this regard.

Figure 4A:
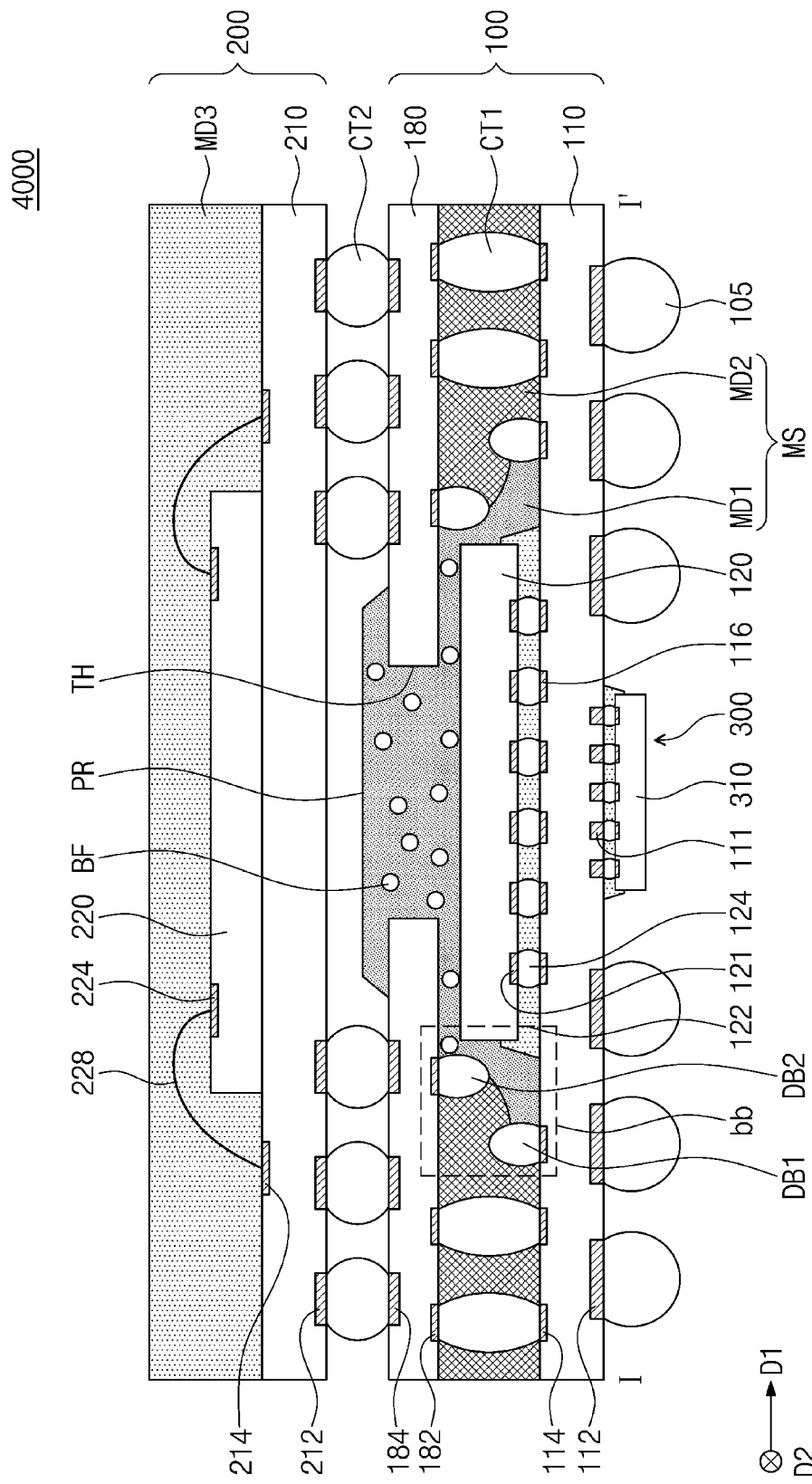
FIG. 4A is a cross-sectional view illustrating a semiconductor package according to embodiments of the inventive concept.
Figure 4B:
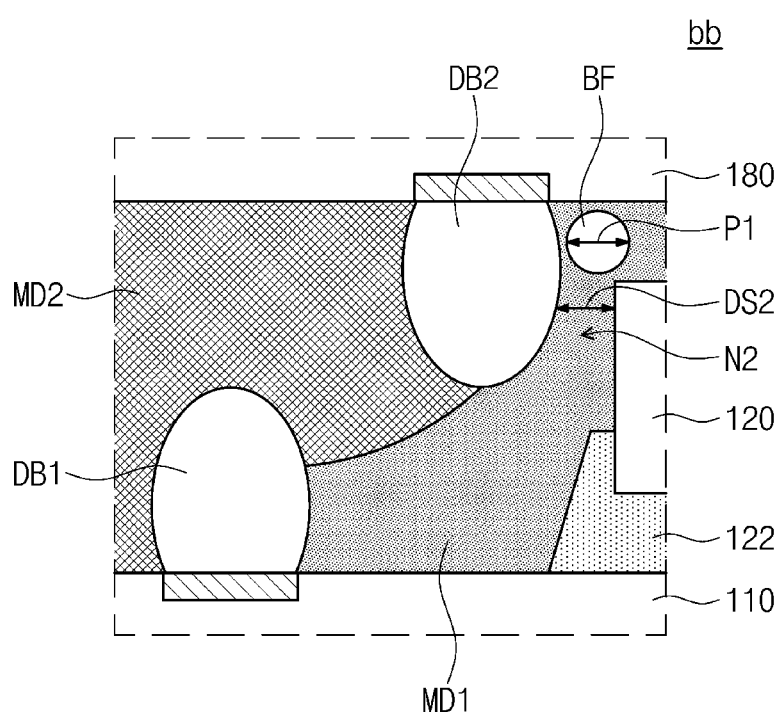
FIG. 4B is an enlarged view of section bb shown in FIG. 4A.

FIG. 4A is a cross-sectional view illustrating a semiconductor package 4000 according to embodiments of the inventive concept, and FIG. 4B is an enlarged view of section 'bb' shown in FIG. 4A.

Referring to FIG. 4A, one or more first barrier(s) DB1 may be provided on the lower package substrate 110, and one or more second barrier(s) DB2 may be provided on the interposer 180. Here, the first barrier(s) DB1 may be first dummy solder ball(s) DB1 and the second barrier(s) DB2 may be second dummy solder ball(s).

The arrangement of the first dummy solder balls DB1 and the second dummy solder balls DB2 may at least partially surround the lower semiconductor chip 120, where the first dummy solder balls DB1 are laterally spaced apart from the lower semiconductor chip 120 by the second dummy solder balls DB2. The first dummy solder balls DB1 may be provided on the second lower substrate pads 116, and the second dummy solder balls DB2 may be provided on the first pads 182. The second lower substrate pads 116 may be omitted which are connected to the first dummy solder balls DB1, and the first pads 182 may be omitted which are connected to the second dummy solder balls DB2. However, neither the first dummy solder balls DB1 nor the second dummy solder balls DB2 is electrically connected to the lower package substrate 110, the lower semiconductor chip 120 and/or the interposer 180.

The first molding member MD1 may include a filler BF. Referring to FIG. 4B, the filler BF may close a space N2 between the second dummy solder balls DB2 and the lower semiconductor chip 120. In some embodiments, the filler BF may have a diameter P1 greater than a width DS2 of the space N2 between the second dummy solder balls DB2 and the lower semiconductor chip 120.

According to certain embodiments of the inventive concept, when the first molding member MD1 is introduced through the through hole TH into a gap between the interposer 180 and the lower package substrate 110, the provision of the first and second dummy solder balls DB1 and DB2 may prevent the first molding member MD1 from contacting the first connection terminal CT1. Moreover, the presence of the filler BF may interrupt flow of the first molding member MD1 in this regard.

Figure 5A:
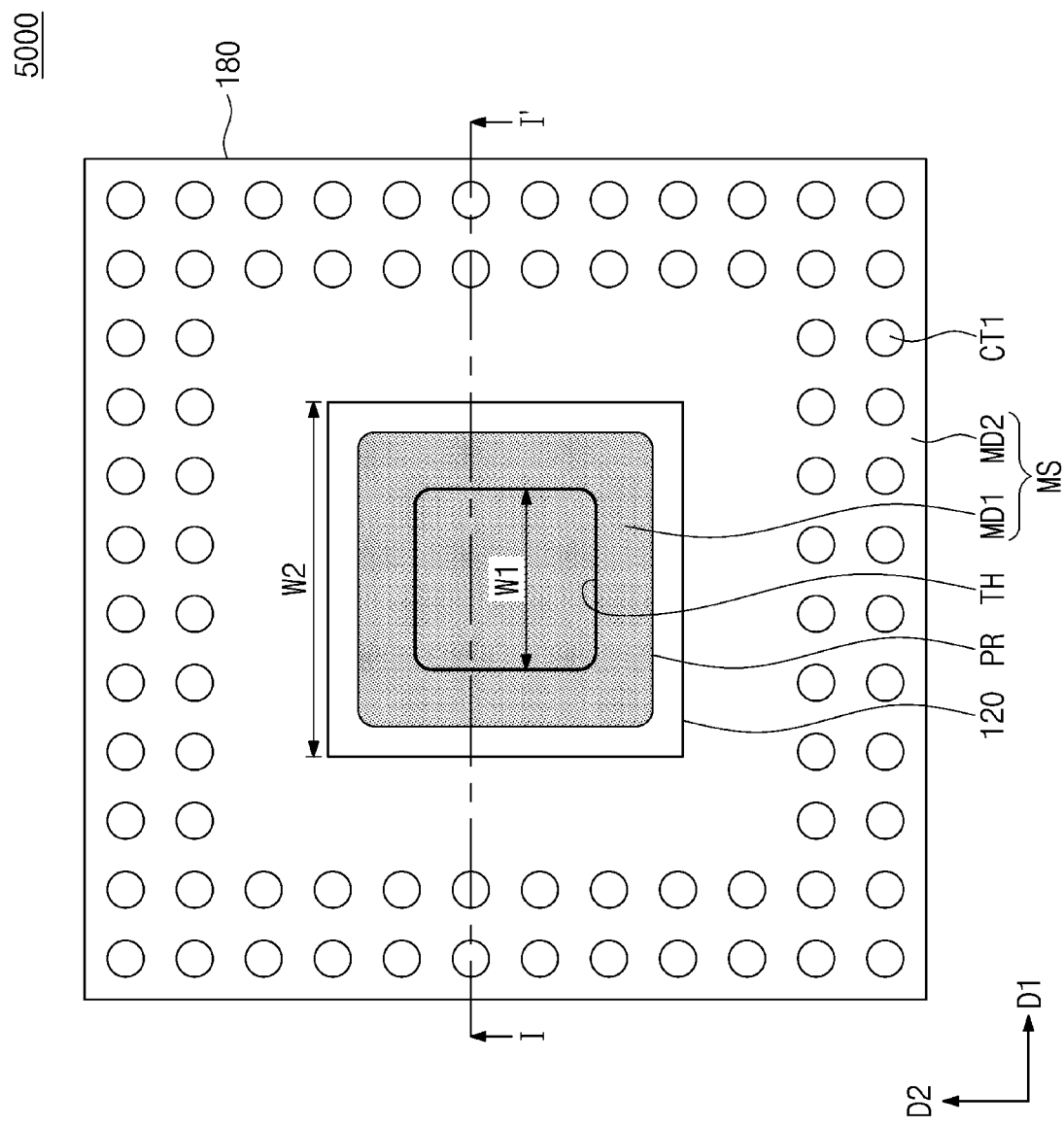
FIG. 5A is a plan view illustrating a semiconductor package according to embodiments of the inventive concept.
Figure 5B:
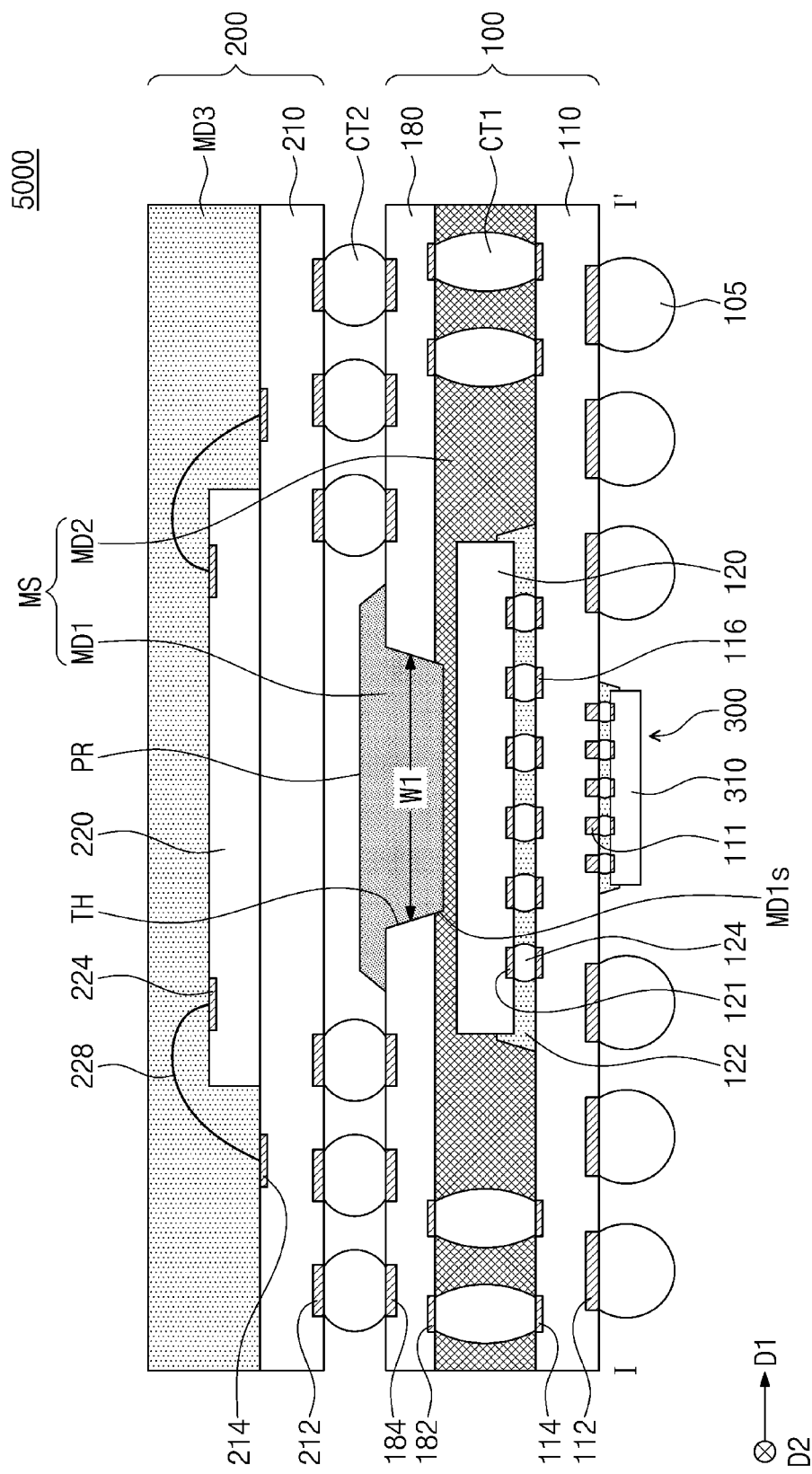
FIGS. 5B and 5C are respective cross-sectional views taken along line I-I' of FIG. 1A.
Figure 5C:
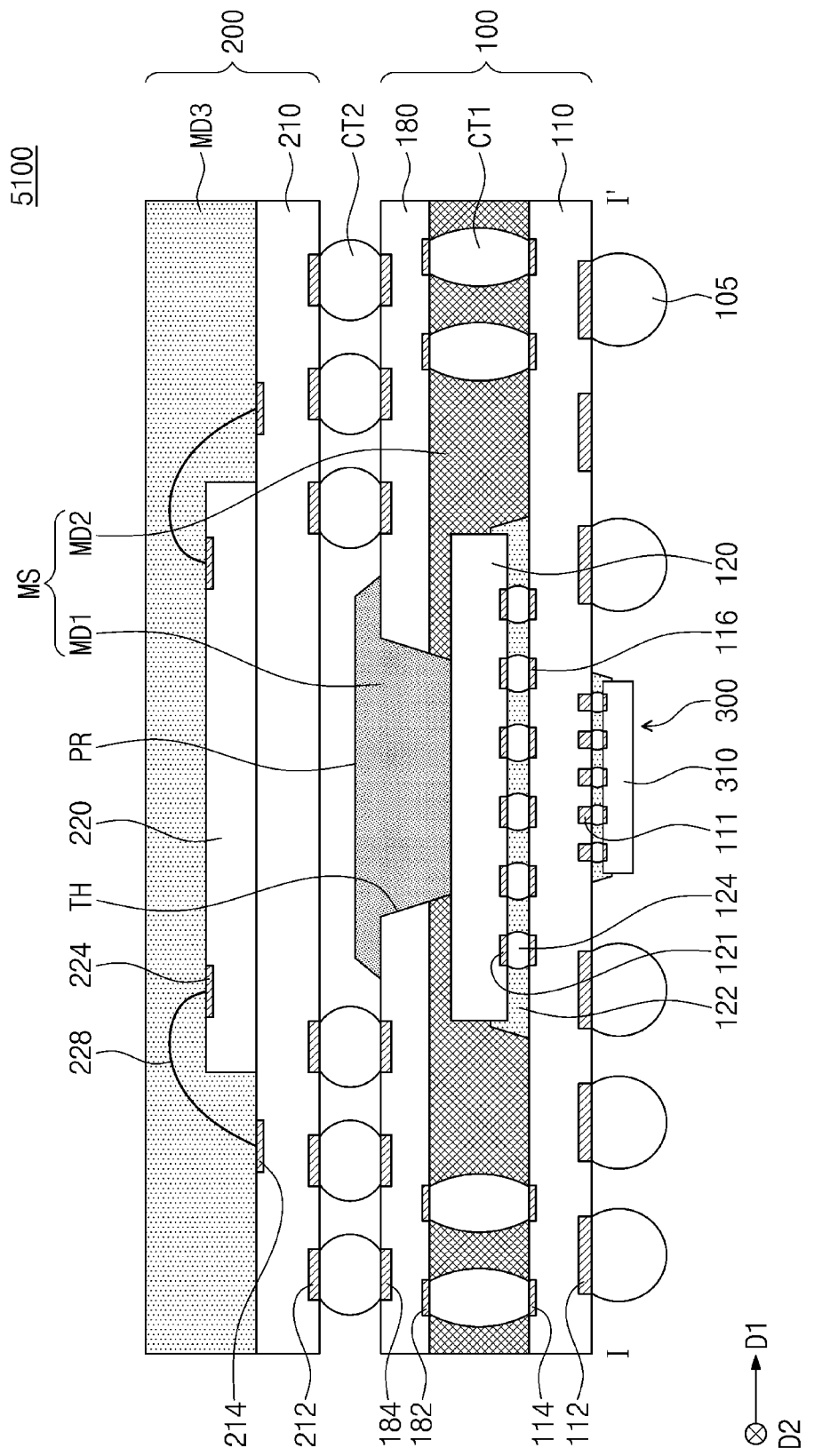

FIG. 5A is a plan view illustrating a semiconductor package 5000 according to embodiments of the inventive concept, and FIGS. 5B and 5C are respective cross-sectional views taken along line I-I' of FIG. 5A.

Referring to FIGS. 5A and 5B, the through hole TH is assumed to have tapered sidewalls. Here, the tapered sidewalls may be defined by a first width W1 that decreases as the tapered sidewalls extend from the top surface of the interposer 180 towards the bottom surface of the interposer 180. When viewed in plan, the first molding member MD1 may at least partially overlap portions of the top surface of the lower semiconductor chip 120. In this regard, the protrusion PR may have a width in the first direction D1 greater than a width in the first direction D1 of the first molding member MD1 below the bottom surface of the interposer 180.

In the illustrated embodiment of FIG. 5B, the first molding member MD1 may have a bottom surface that is vertically spaced apart from the top surface of the lower semiconductor chip 120. As a result, the second molding member MD2 may extend between the lower semiconductor chip 120 and the first molding member MD1. For example, the second molding member MD2 may cover the top surface and edge surfaces of the lower semiconductor chip 120, as well as the lateral surfaces of the under-fill layer 122. The first molding member MD1 and the second molding member MD2 may contact each other at a boundary MD1s extending substantially along and above the top surface of the lower semiconductor chip 120.

Alternately, in the illustrated embodiment of FIG. 5C, the bottom surface of the first molding member MD1 may contact the top surface of the lower semiconductor chip 120. Accordingly, the second molding member MD2 need not extend substantially under the bottom surface of the interposer 180 and the first molding member MD1 may be used to cover the central portion of the lower semiconductor chip 120. The second molding member MD2 may cover an edge surfaces of the lower semiconductor chip 120 not covered by the under-fill layer 122.

Figure 6A:
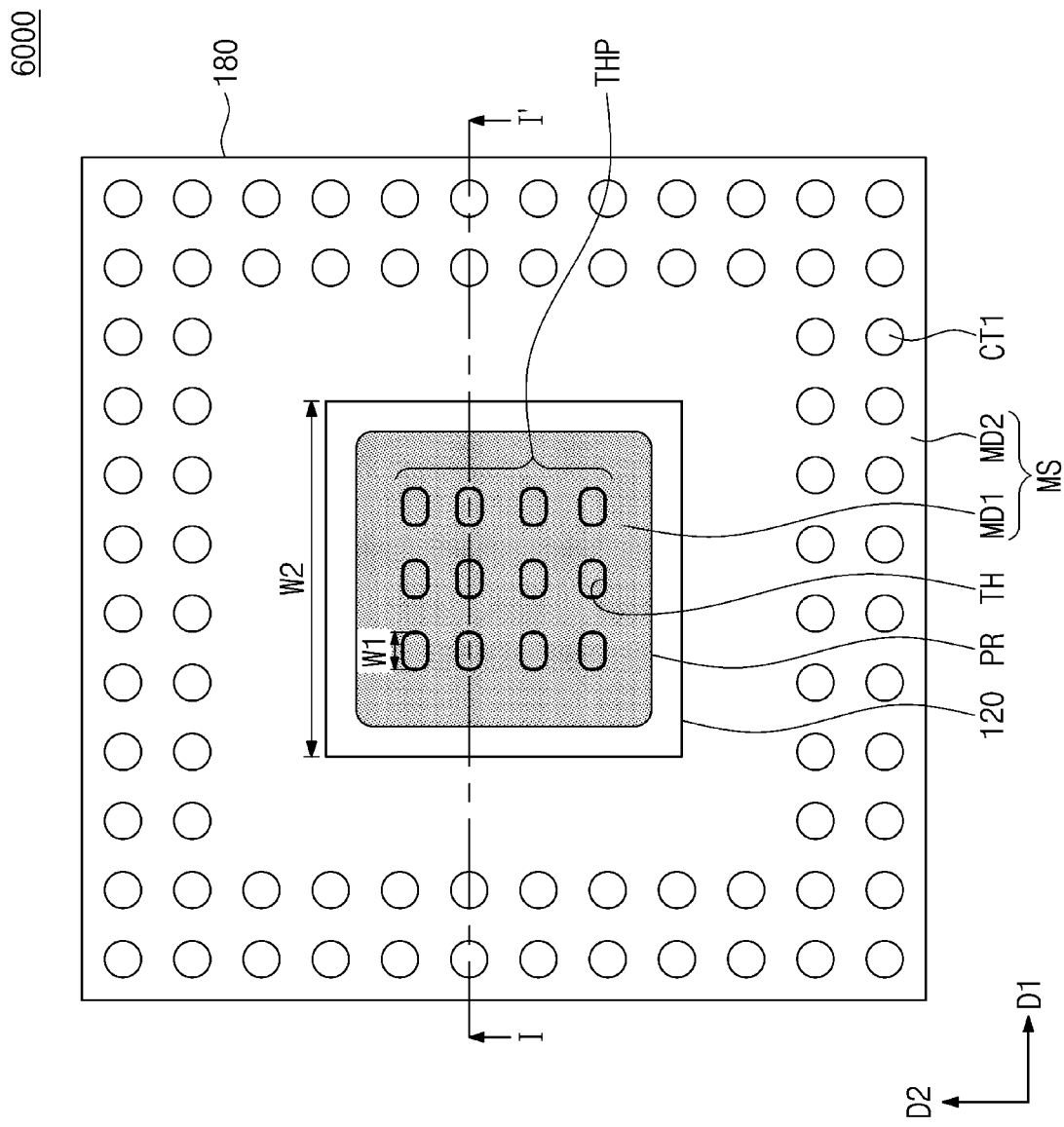
FIG. 6A is a plan view illustrating a semiconductor package according to embodiments of the inventive concept.
Figure 6B:
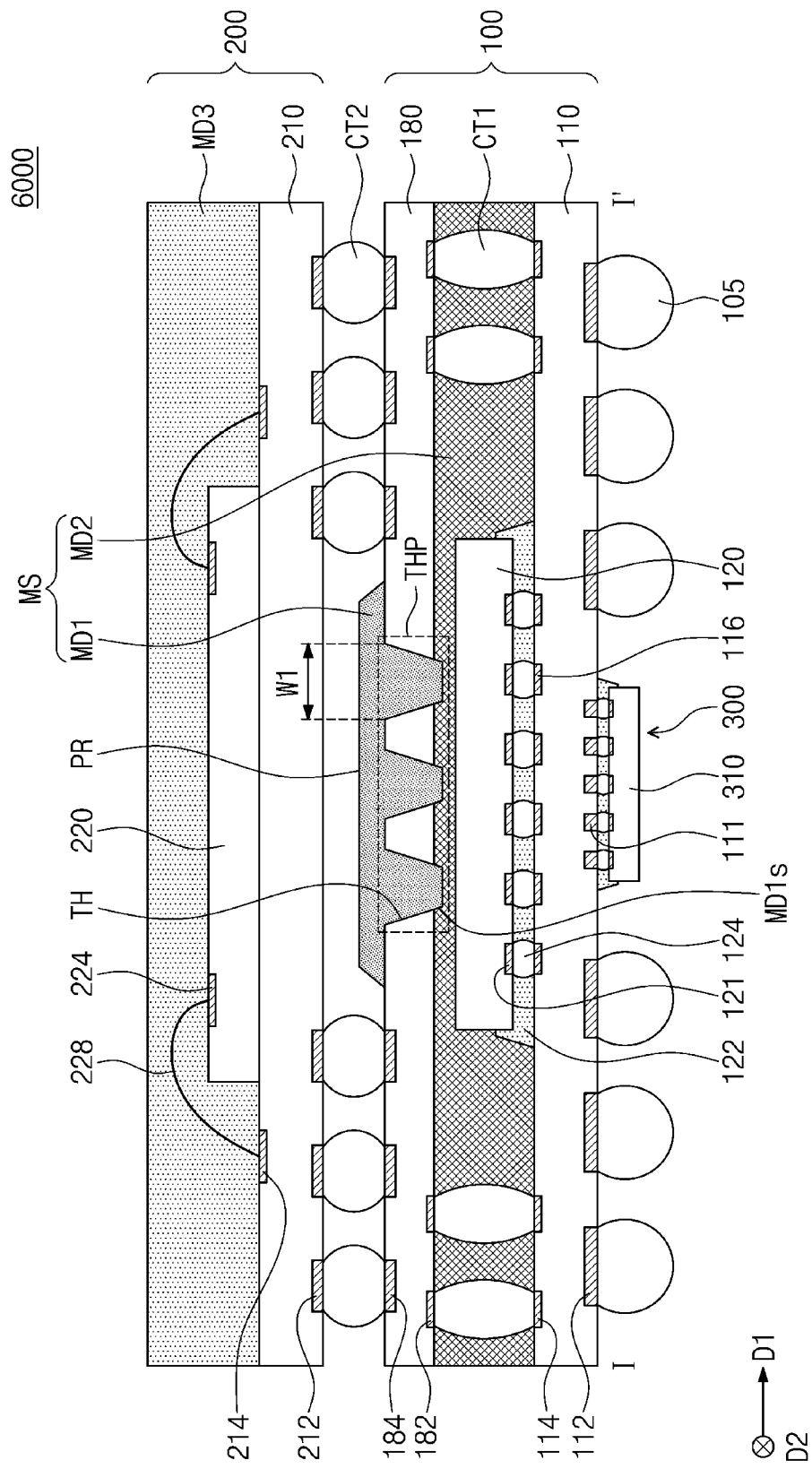
FIG. 6B is a cross-sectional view taken along line I-I' of FIG. 2A FIGS. 7A, 7B, 7C, 7D and 7E are related cross-sectional views illustrating in one example a method of fabricating a semiconductor package according to embodiments of the inventive concept.

FIG. 6A is a plan view illustrating a semiconductor package 6000 according to embodiments of the inventive concept, and FIG. 6B is a cross-sectional view taken along line I-I' of FIG. 6A.

Referring to FIGS. 6A and 6B, the interposer 180 may include an opening defined by a through hole group THP like the one previously described in relation to FIGS. 2A and 2B, except that instead of the respective through holes TH having vertical sidewalls, they have tapered sidewalls. In this regard, and as illustrated in FIG. 6B, the sidewalls of the respective through holes TH may be defined by sidewalls having a first width W1 that decreases as the respective through hole TH extends from the top surface of the interposer 180 towards the bottom surface of the interposer 180. The through holes TH may be arranged in the first direction D1 and/or the second direction D2, such that the resulting through hole group THP overlaps at least a portion of the lower semiconductor chip 120. The first molding member MD1 may be introduced into a gap between the lower semiconductor chip 120 and the interposer 180 using the through hole group THP.

The first molding member MD1 may have a bottom surface vertically spaced apart from the top surface of the lower semiconductor chip 120. The second molding member MD2 may be interposed between the lower semiconductor chip 120 and the first molding member MD1. In this regard, the second molding member MD2 may cover the top surface and edge surfaces of the lower semiconductor chip 120, as well as lateral surfaces of the under-fill layer 122. The first molding member MD1 and the second molding member MD2 may contact each other at a boundary MD1s extending along (and above) the top surface of the lower semiconductor chip 120. Alternately, the bottom surface of the first molding member MD1 may contact the top surface of the lower semiconductor chip 120, as previously described in relation to FIG. 5C.

FIGS. 7A, 7B, 7C, 7D and 7E are related cross-sectional views illustrating in one example a method of fabricating a semiconductor package according to embodiments of the inventive concept.

Figure 7A:
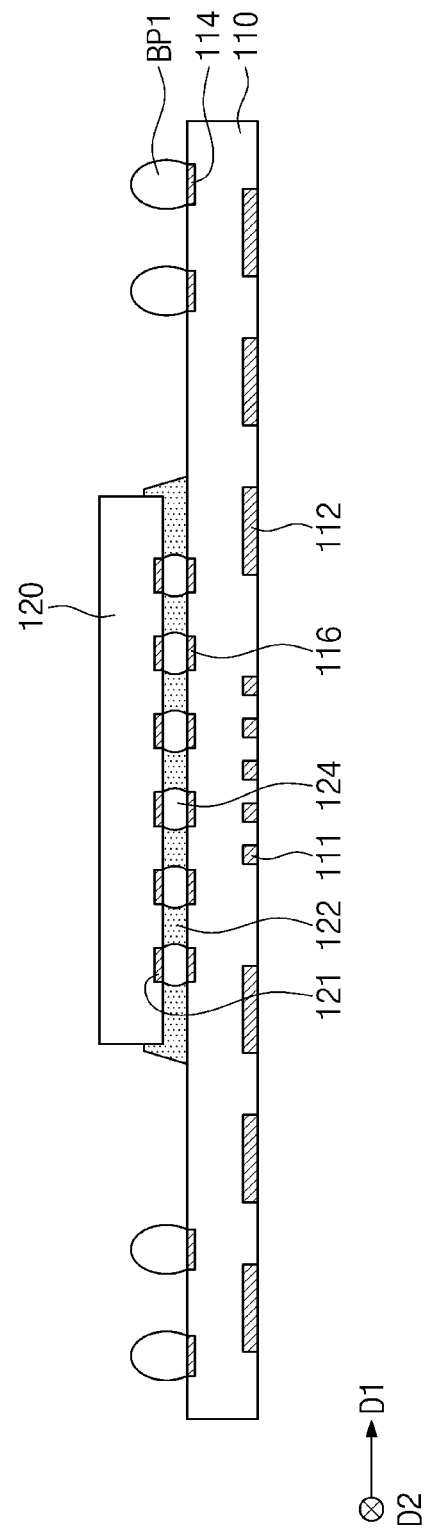

Referring to FIG. 7A, a lower semiconductor chip 120 may be mounted on a lower package substrate 110. For example, the lower semiconductor chip 120 may be flip-chip mounted on the lower package substrate 110. First bumps BP1 may be formed to at least partially surround the lower semiconductor chip 120. The first bumps BP1 may be formed on first lower substrate pads 114 on a top surface of the lower package substrate 110. An under-fill layer 122 may be formed between the lower package substrate 110 and the lower semiconductor chip 120.

Figure 7B:
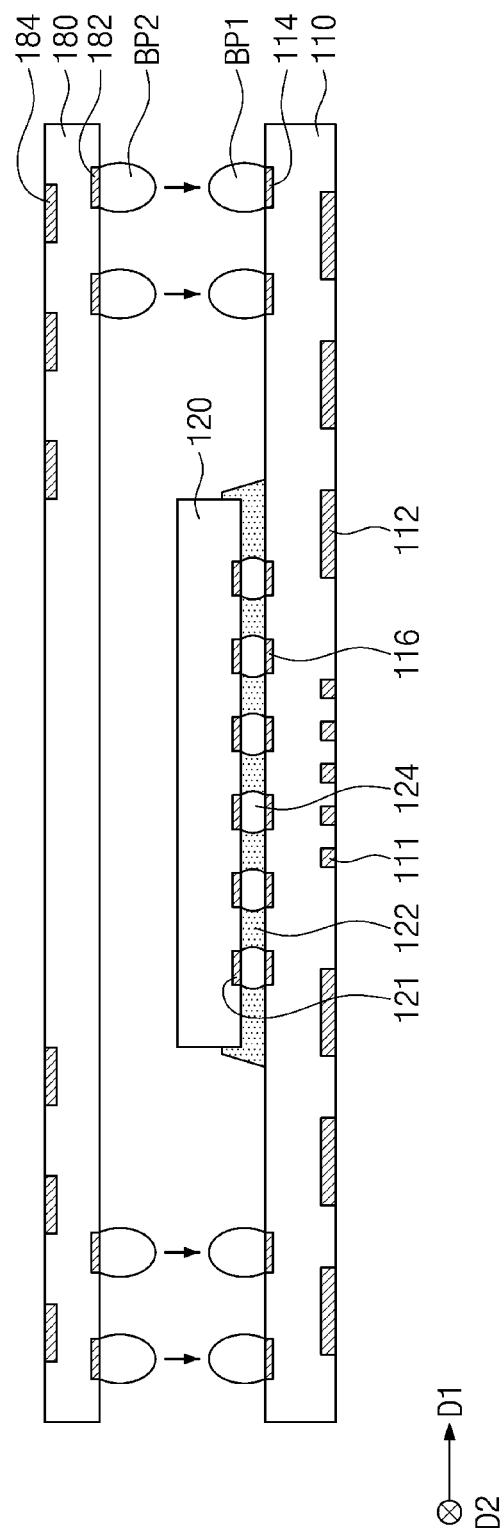
Figure 7C:
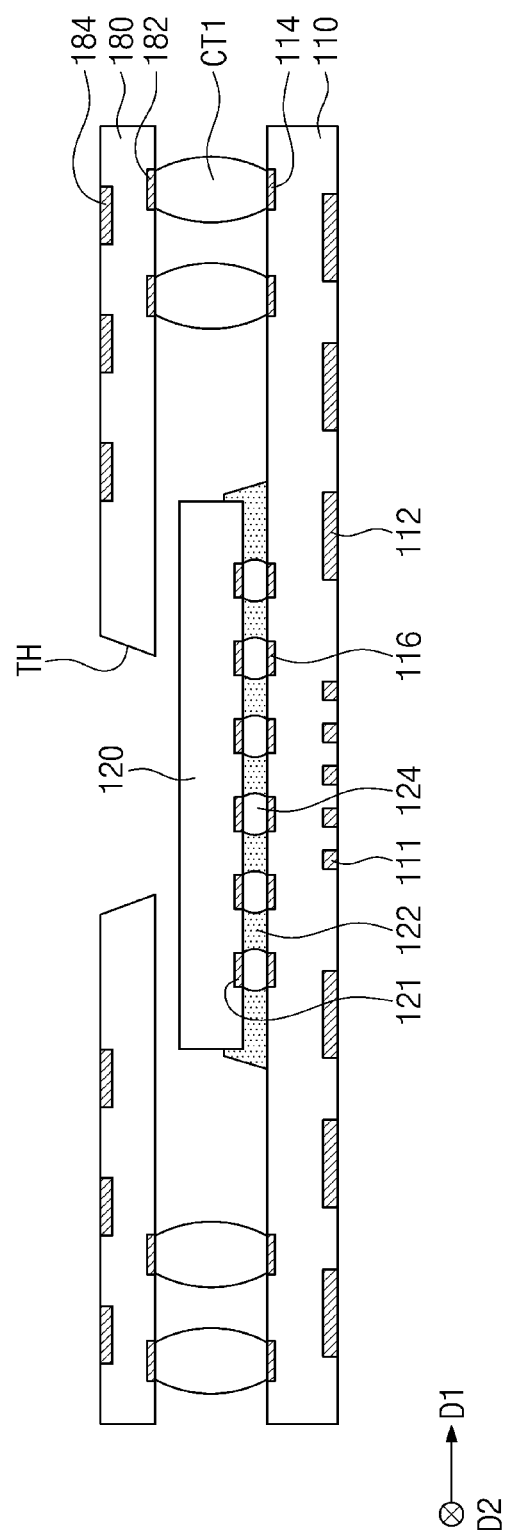

Referring to FIGS. 7B and 7C, second bumps BP2 may be formed on first pads 182 of an interposer 180, wherein the second bumps BP2 are aligned with corresponding first bumps BP1. Then, a reflow process may be used to mount the interposer 180 on the lower semiconductor chip 120 and the lower package substrate 110. In this particular approach, the first bumps BP1 and the second bumps BP2 form first connection terminals CT1.

Thereafter, a through hole TH may be formed in a central portion of the interposer 180 to at least partially expose a top surface of the lower semiconductor chip 120. The through hole TH may be formed (e.g.,) using a laser drilling process. The through hole TH may have tapered sidewalls defined by a first width W1 that decreases as the sidewalls extend from a top surface of the interposer 180 towards a bottom surface of the interposer 180. Alternately, a plurality of through holes TH forming a through hole group THP may be formed as previously described in relation to FIGS. 2B and 6B, for example.

Figure 7D:
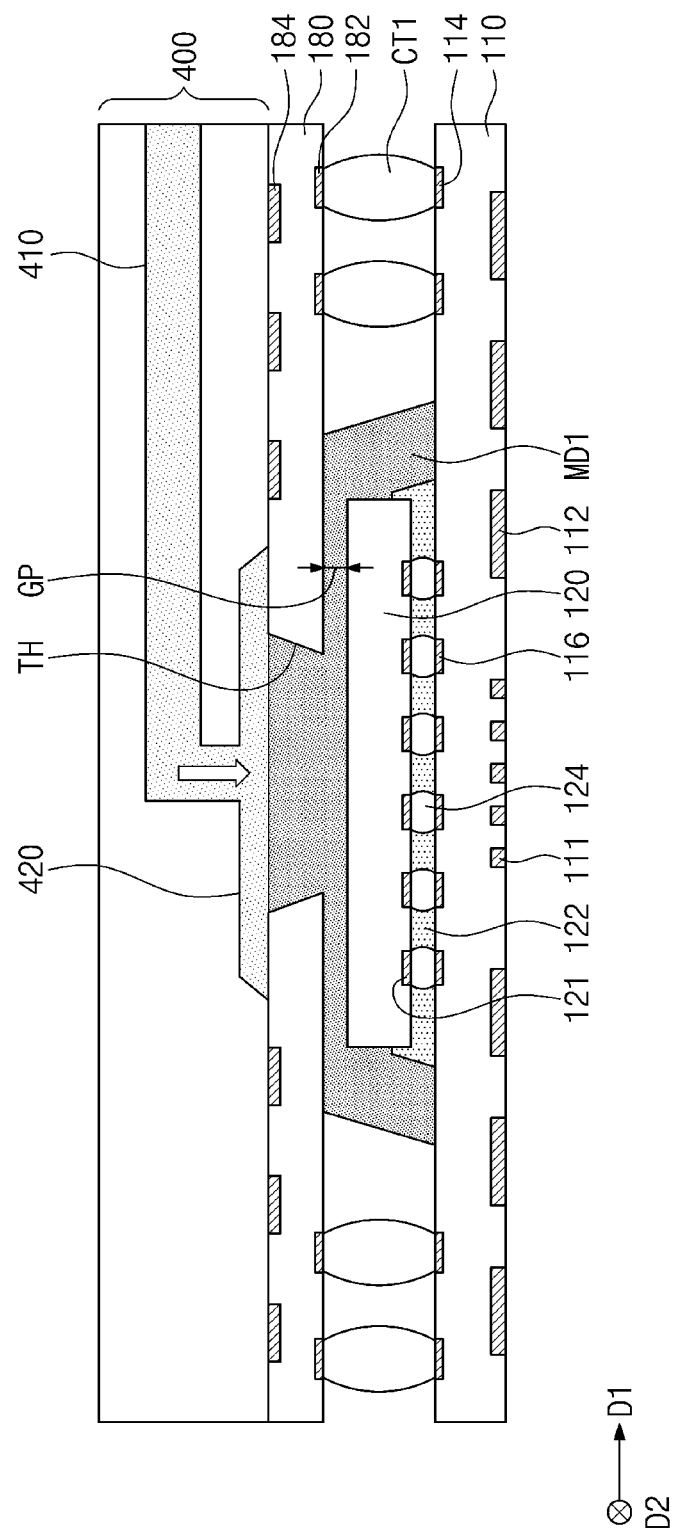
Figure 7E:
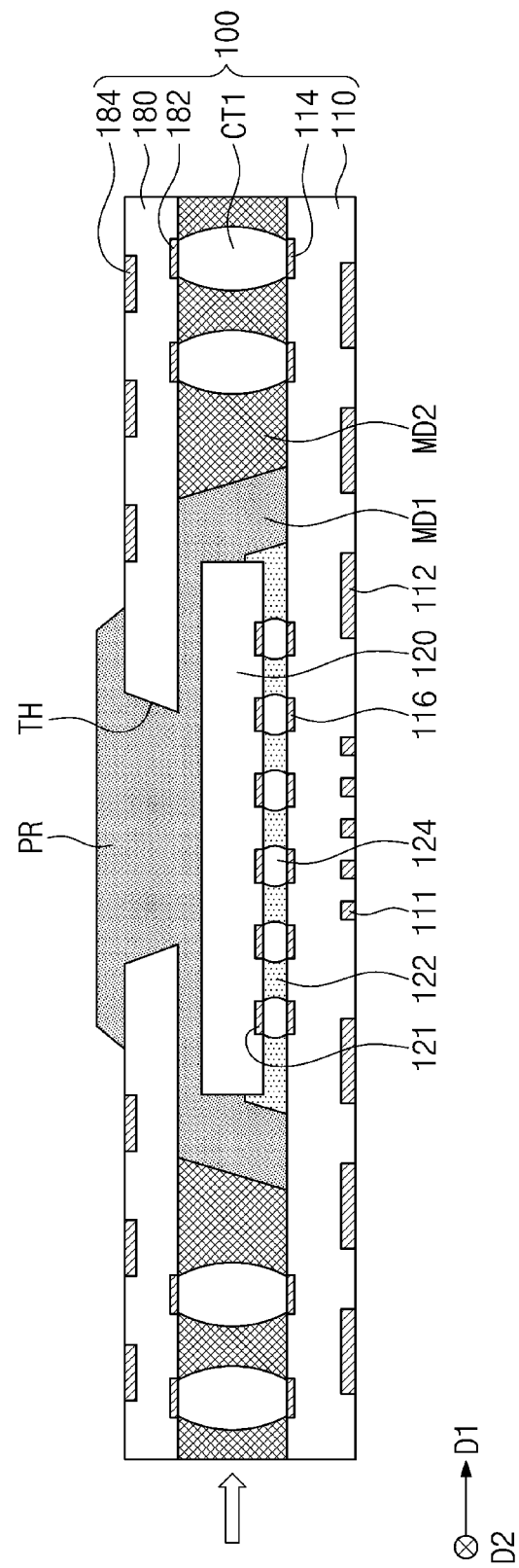

Referring to FIGS. 7D and 7E, a first molding member MD1 in a melted state may be introduced through the through hole TH of the interposer 180. In this regard, a molding material injector 400 including a connection part 410 and an injection part 420 may be used to inject melted material(s) constituting the first molding member MD1. That is, the melted material(s) constituting the first molding member MD1 may be discharged from the injection part 420 after being conveyed through the connection part 410.

As a result, the first molding member MD1 may cover the top surface of the lower semiconductor chip 120 as well as portions of the edge surfaces of the lower semiconductor chip 120, lateral surfaces of the under-fill layer 122, and portions of the top surface of the lower package substrate 110 proximate the lower semiconductor chip 120. However, the injection of melted material(s) constituting the first molding member MD1 should be controlled to avoid the first molding member MD1 from contacting the first connection terminal CT1. For example, once the melted materials forming the lower portions of the first molding member MD1 have solidify, the protrusion portion PR of the first molding member MD1 may be formed by further addition of melted material(s). In certain embodiments, the protrusion PR may have a shape corresponding to a shape of the injection part 420. In this manner, the geometry of the injection part 420 (or a distal portion of the injection part 420) may be used to define the geometry of the protrusion PR, wholly or in part. Further, the protrusion PR should be controlled in its geometry to avoid contacting the second pads 184 on the top surface of the interposer 180, or a bottom surface of a later added, upper package substrate.

Referring to FIG. 7E, melted material(s) constituting the second molding member MD2 may be laterally introduced to cover the first connection terminal CT1 and contact the first molding member MD1.

Since certain embodiments of the inventive concept allow for the introduction of melted material(s) constituting the first molding member MD1 through an opening (e.g., a through hole TH or a though hole group THP) formed in the interposer 180, and further allow for the lateral introduction of a melted material(s) constituting the second molding member MD2, the overall height of the lower package 100 may be reduced. In particular a gap distance GP between the top surface of the lower semiconductor chip 120 and the bottom surface of the interposer 180 may be narrowed.

Referring back to FIG. 1B, the upper package 200 may be mounted on the lower package 100, where the upper package 200 may include an upper package substrate 210 and an upper semiconductor chip 220 mounted on the upper package substrate 210. Solder balls on a lower portion of the upper package 200 may be connected to the second pads 184 on the interposer 180, and a reflow process may form second connection terminals CT2. The upper package substrate 210 may be spaced apart from the top surface of the interposer 180 and the first molding member MD1. Afterwards, external terminals 105 and a passive device package 300 may be formed on a bottom surface of the lower package substrate 110.

Figure 8:
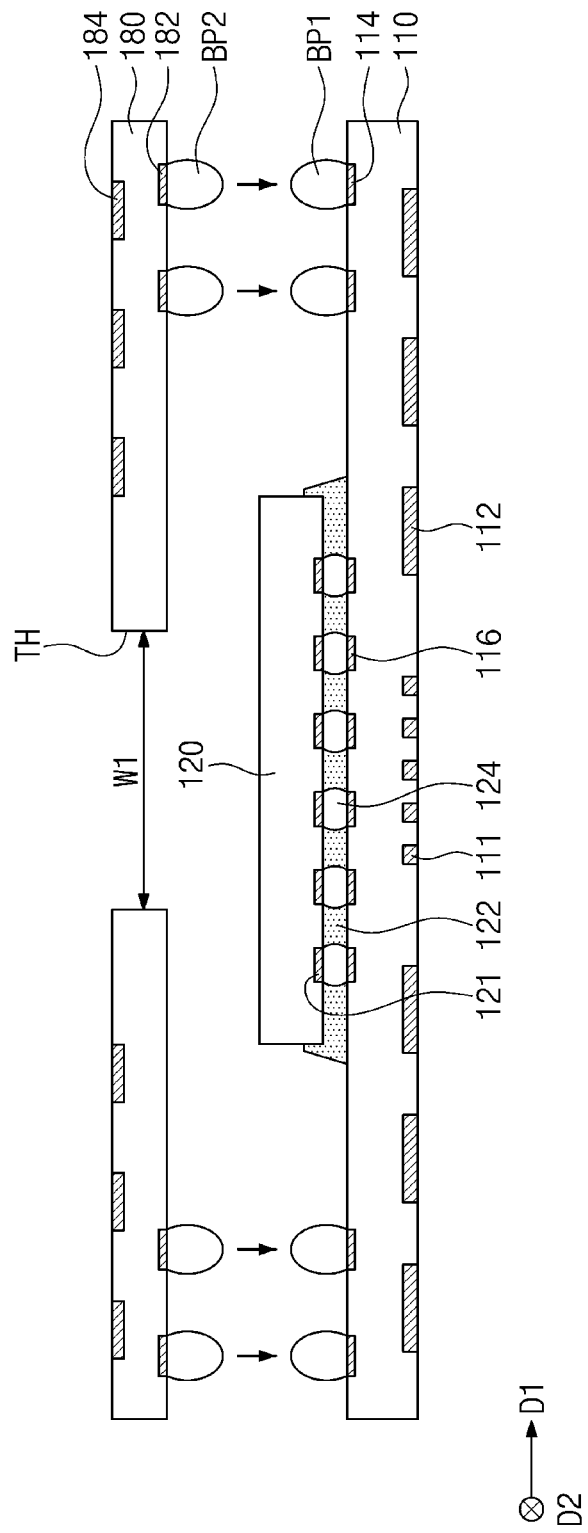
FIGS. 8 and 9 are respective cross-sectional views variously illustrating methods of fabricating a semiconductor package according to embodiments of the inventive concept.

FIG. 8 is a cross-sectional view illustrating in one example a method of fabricating a semiconductor package according to embodiments of the inventive concept.

Referring to FIGS. 7A and 8, before the interposer 180 is mounted on the lower package substrate 110, the through hole TH may be formed. Here, the through hole TH may be formed (e.g.,) using a piercing or punching process. The through hole TH may be defined by sidewalls separated by a first width W1 that is substantially constant as the sidewalls extend from the top surface towards the bottom surface of the interposer 180. Alternately, a plurality of through holes TH forming a through hole group THP may be used, as previously described in relation to FIG. 2B.

Once the through hole TH is formed in the interposer 180, the interposer 180 may be mounted on the lower package substrate 110 and the lower semiconductor chip 120. Subsequent processes may be the same as those discussed with reference to FIGS. 7C, 7D and 7E.

Figure 9:
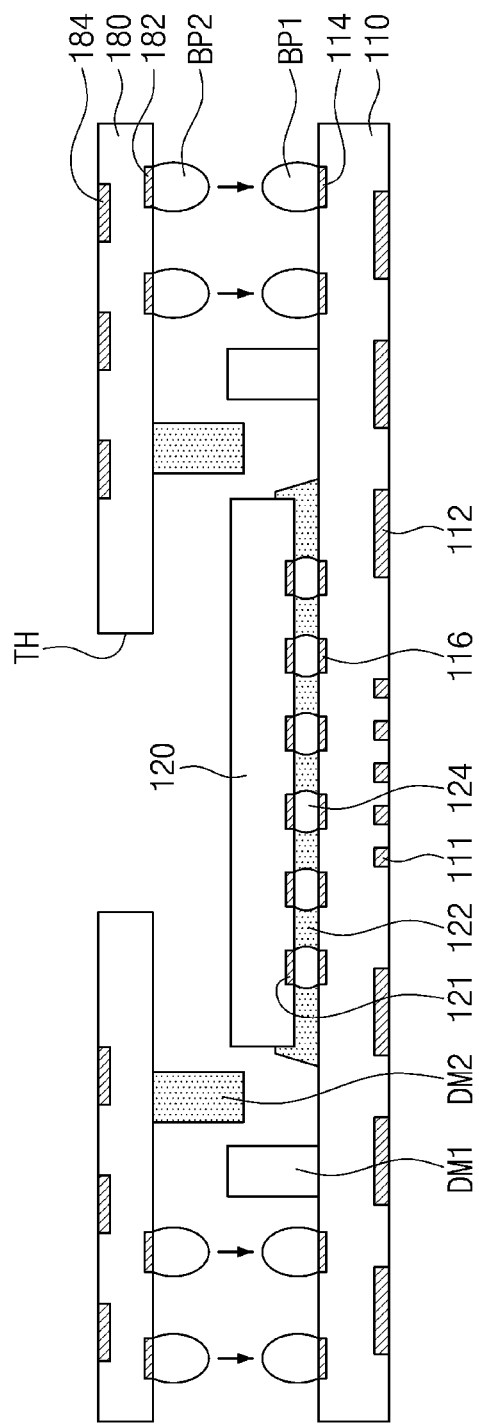

FIG. 9 is a cross-sectional view illustrating in one example a method of fabricating a semiconductor package according to embodiments of the inventive concept.

Referring to FIG. 9, the first dam structure DM1 of FIGS. 3A and 3B (or alternately, the first dummy solder balls DB1 of FIG. 4A) may be mounted on the lower package substrate 110, and the second dam structure DM2 of FIGS. 3A and 3B (or alternately, the second dummy solder balls DB1 of FIG. 4A) may be mounted on the bottom surface of the interposer 180. The first dam structure DM1 (or the first dummy solder balls DB1) and the second dam structure DM2 (or the second dummy balls DB2) should not overlap of contact each other. Subsequent processes may be the same as those discussed with reference to FIGS. 7C, 7D and 7E. However, in the step described in relation to FIG. 7D, the first molding member MD1 may further include the filler BF.

FIGS. 10A, 10B, 10C and 10D are related cross-sectional views illustrating in one example a method of fabricating a semiconductor package according to embodiments of the inventive concept.

Figure 10A:
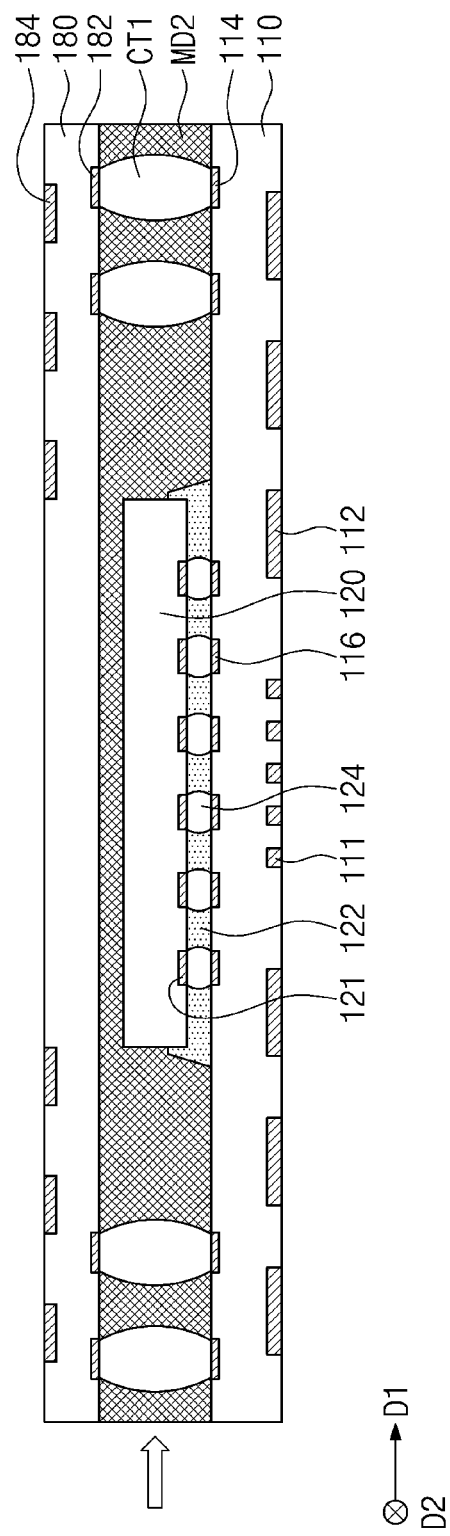
FIGS. 10A, 10B, 10C and 10D are related cross-sectional views illustrating in one example a method of fabricating a semiconductor package according to embodiments of the inventive concept.

Referring to FIG. 10A, melted materials constituting the second molding member MD2 may be laterally introduced between the interposer 180 and the lower package substrate 110 to substantially surround the lower semiconductor chip 120. In this regard, the melted material(s) constituting the second molding member MD2 may cover the top surface of the lower semiconductor chip 120, exposed side surfaces of the lower semiconductor chip 120, and the first connection terminal CT1. The melted material(s) are then allowed to solidify to form the second molding member MD2.

Figure 10B:
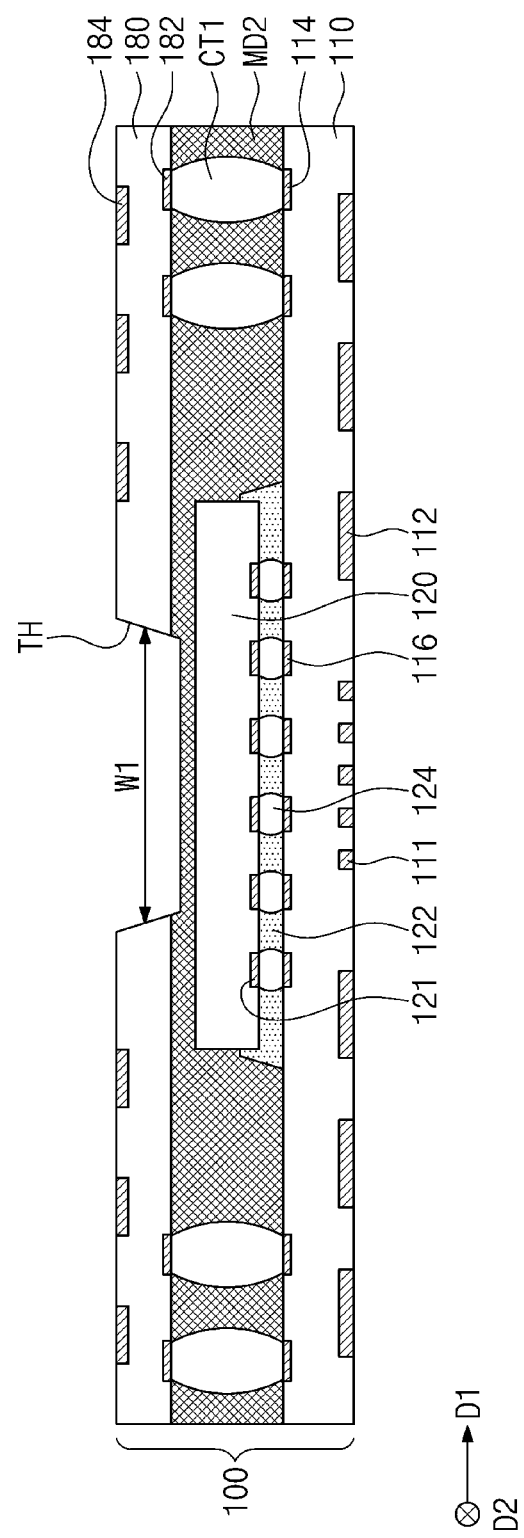

Referring to FIG. 10B, a through hole TH may be formed to create an opening in the interposer 180. The through hole TH may be formed (e.g.,) using a laser drilling process that may remove some thickness of the second molding member MD2. In some embodiments, the laser drilling process will not expose any portion of the top surface of the lower semiconductor chip 120, while in other embodiments, the laser drilling process may be used to fully expose the top surface of the lower semiconductor chip 120. The through hole TH may be formed with tapered sidewalls separated by a first width W1 that decreases as the sidewalls extend from the top surface towards the bottom surface of the interposer 180.

Figure 10C:
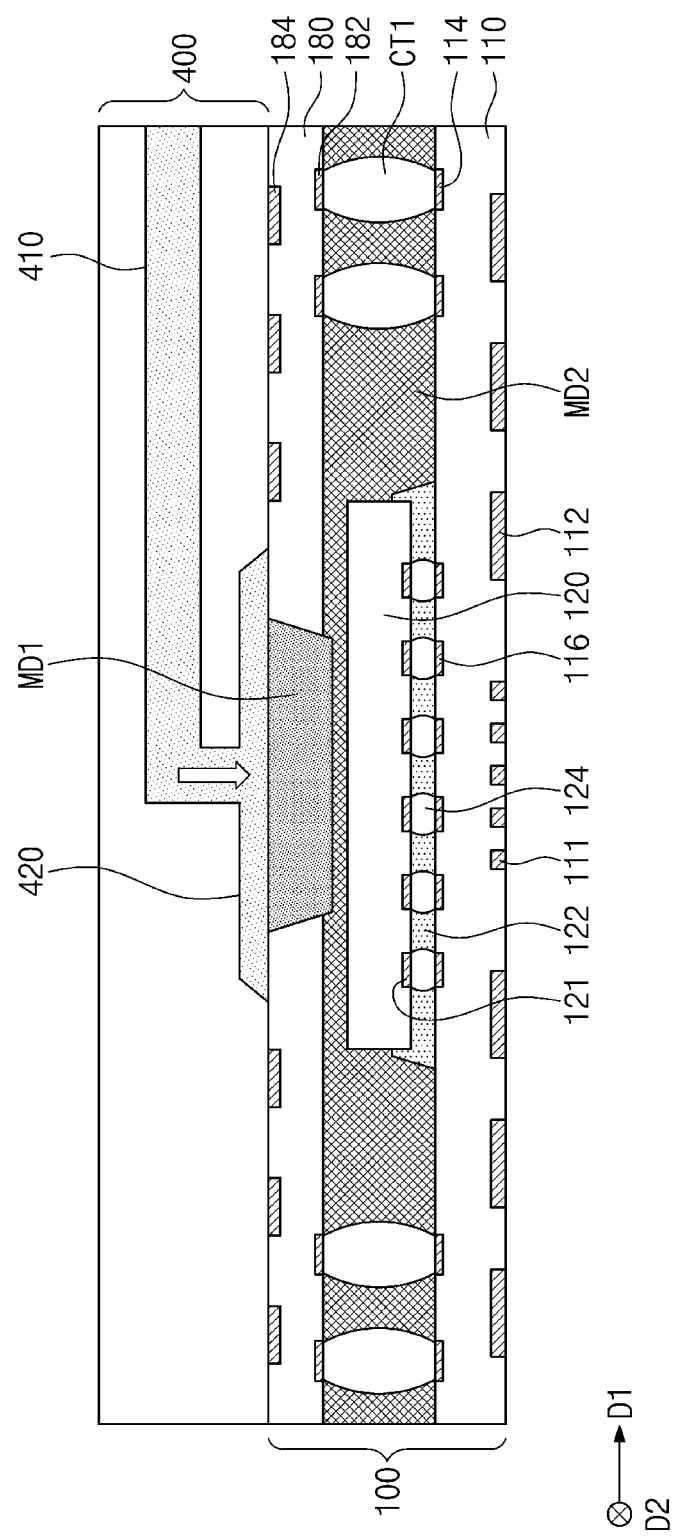
Figure 10D:
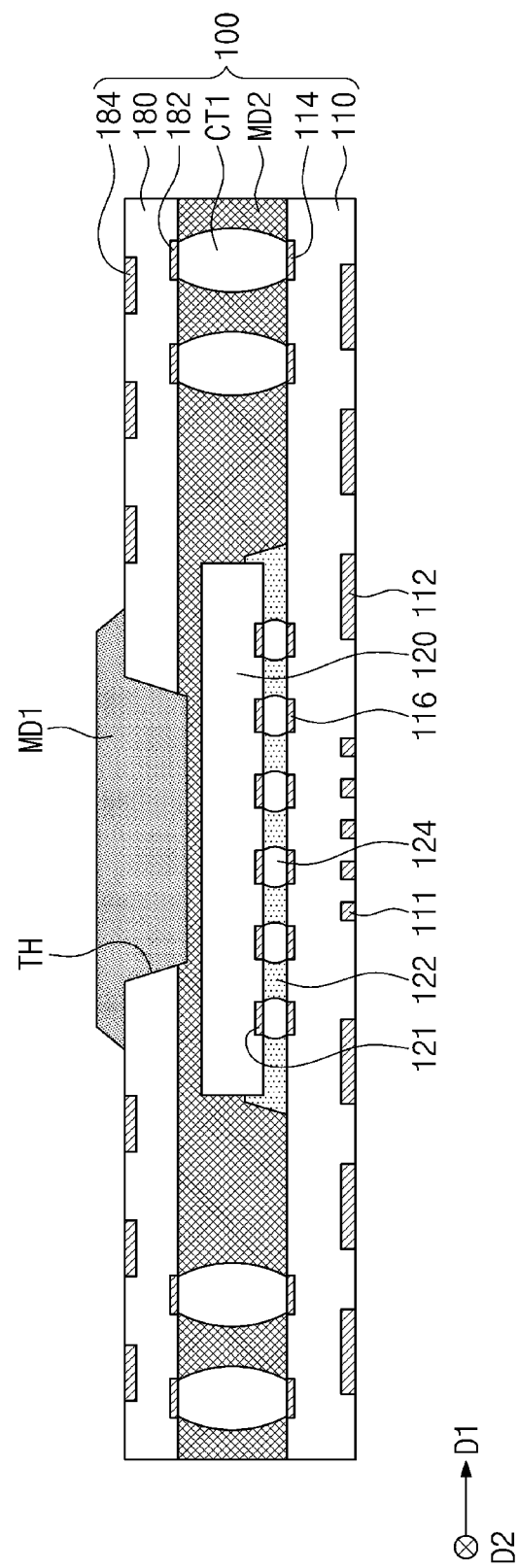

Referring to FIGS. 10C and 10D, melted material(s) constituting the first molding member MD1 may be introduced through the through hole TH to cover at least a portion of the top surface of the lower semiconductor chip 120. In this regard, the first molding member MD1 may be separated from the top surface of the lower semiconductor chip 120 by a residual portion of the second molding member MD2, or the melted first molding member MD1 may directly contact the top surface of the lower semiconductor chip 120.

Referring back to FIG. 5B, an upper package 200 may be mounted on the lower package 100, and then external terminals 105 and a passive device package 300 may be formed to fabricate the semiconductor package 5000.

In certain embodiments of the inventive concept, a semiconductor package may include a lower package including therein a first molding member and a second molding member, wherein the first molding member and the second molding member are formed from different material(s). The first molding member may have thermal conductivity greater than that of the second molding member. An interposer may include a through hole, and the first molding member may be introduced via the through hole and include a protrusion that extends outward from the through hole. Heat generated by a lower semiconductor chip may be readily exhausted through the first molding member, thereby decreasing thermal resistance and improving reliability of the semiconductor package.

In certain embodiments of the inventive concept a method of fabricating a semiconductor package provides a molding material that may be introduced via a through hole formed in an interposer, such that even when a lower semiconductor chip and the interposer are separated by a very narrow gap, the semiconductor package may be fabricated with a reduced height.

Although the inventive concept has been described in connection with certain embodiments illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a lower semiconductor chip mounted on a top surface of a lower package substrate;
   an interposer disposed above the lower package substrate and including an opening;
   a first molding member including a first material, filling the opening; and
   a second molding member including a second material different from the first material, covering a top surface of the lower semiconductor chip,
   wherein the first molding member includes a protrusion that extends to protrude from the top surface of the interposer,
   wherein the protrusion covers a portion of the top surface of the interposer, and
   wherein the protrusion has a first width in a first direction greater than a second width in the first direction of the first molding member below a bottom surface of the interposer.

2. The semiconductor package of claim 1, wherein the opening has a third width along the first direction, the lower semiconductor chip has a fourth width in the first direction, and the third width is smaller than the fourth width.

3. The semiconductor package of claim 1, wherein the first molding member is vertically spaced apart from the lower semiconductor chip with the second molding member interposed therebetween.

4. The semiconductor package of claim 1, wherein the first molding member is spaced apart from the lower package substrate.

5. The semiconductor package of claim 1, wherein when viewed in plan, the first molding member partially overlaps the top surface of the lower semiconductor chip.

6. The semiconductor package of claim 1, wherein the second molding member extends between the lower semiconductor chip and the first molding member.

7. The semiconductor package of claim 1, wherein the first material has a thermal conductivity greater than a thermal conductivity of the second material.

8. The semiconductor package of claim 1, wherein the first material includes at least one of copper paste, silver paste and an epoxy molding compound containing a metal filler, and the second material is non-conductive.

9. The semiconductor package of claim 8, wherein the second material has a polymer density greater than a polymer density of the first material.

10. The semiconductor package of claim 1, wherein the first molding member and the second molding member contact each other, and have therebetween a boundary positioned on the top surface of the lower semiconductor chip.

\* \* \* \* \*